United States Patent
Izumi et al.

(10) Patent No.: US 7,825,439 B2
(45) Date of Patent: Nov. 2, 2010

(54) SEMICONDUCTOR MEMORY

(75) Inventors: Tatsuo Izumi, Yokohama (JP); Takeshi Kamigaichi, Yokohama (JP); Shinya Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 12/191,592

(22) Filed: Aug. 14, 2008

(65) Prior Publication Data
US 2009/0057814 A1   Mar. 5, 2009

(30) Foreign Application Priority Data
Aug. 29, 2007   (JP)   ............... 2007-222783

(51) Int. Cl.
*H01L 29/768*   (2006.01)
(52) U.S. Cl. ........... 257/241; 257/E29.17; 257/E29.261
(58) Field of Classification Search ................ 257/241, 257/287, 314, 315, 316, 390, 365, 374, 401, 257/E29.17, E29.261
See application file for complete search history.

(56) References Cited

U.S. PATENT DOCUMENTS

| | | | |
|---|---|---|---|
| 6,475,891 B2 | 11/2002 | Moon | |
| 2002/0132424 A1 | 9/2002 | Furuhata | |
| 2006/0194429 A1 | 8/2006 | Hashimoto et al. | |
| 2007/0105334 A1* | 5/2007 | Jang et al. | 438/396 |
| 2008/0006869 A1 | 1/2008 | Kamigaichi et al. | |
| 2009/0057814 A1 | 3/2009 | Izumi et al. | |

FOREIGN PATENT DOCUMENTS

| | | |
|---|---|---|
| JP | 5-88375 | 4/1993 |
| JP | 8-46159 | 2/1996 |
| JP | 8-55920 | 2/1996 |
| JP | 11-97652 | 4/1999 |
| JP | 2005-116551 | 4/2005 |
| JP | 2006-156657 | 6/2006 |
| JP | 2007-165862 | 6/2007 |

OTHER PUBLICATIONS

U.S. Appl. No. 12/191,592, filed Aug. 14, 2008, Izumi, et al.
U.S. Appl. No. 12/729,626, filed Mar. 23, 2010, Shino, et al.

* cited by examiner

*Primary Examiner*—Quoc D Hoang
(74) *Attorney, Agent, or Firm*—Oblon, Spivak, McClelland, Maier & Neustadt, L.L.P.

(57) ABSTRACT

A semiconductor memory according to an example of the invention includes active areas, and element isolation areas which isolate the active areas. The active areas and the element isolation areas are arranged alternately in a first direction. An n-th (n is odd number) active area from an endmost portion in the first direction and an (n+1)-th active area are coupled to each other at an endmost portion in a second direction perpendicular to the first direction.

18 Claims, 44 Drawing Sheets

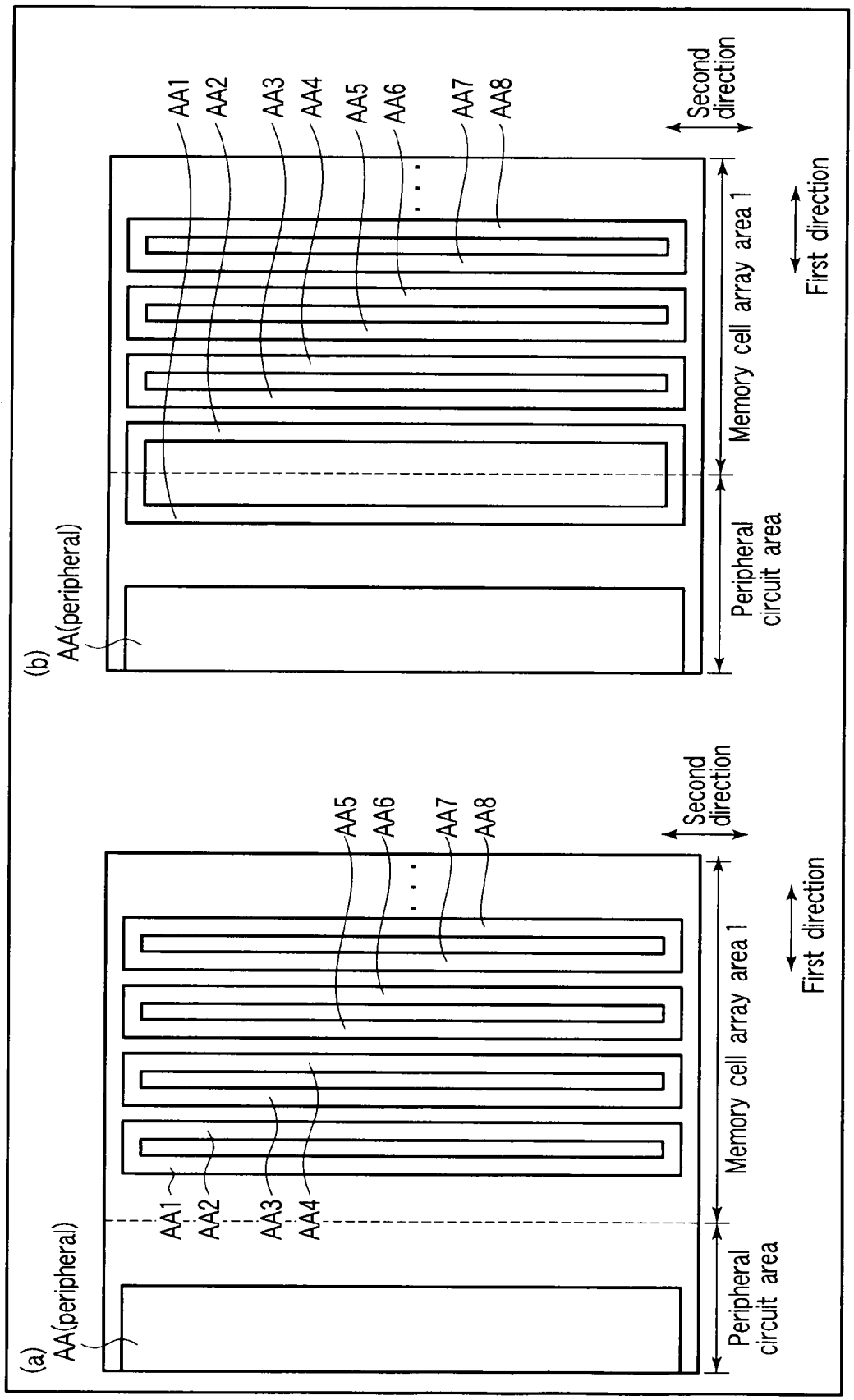
F I G. 2

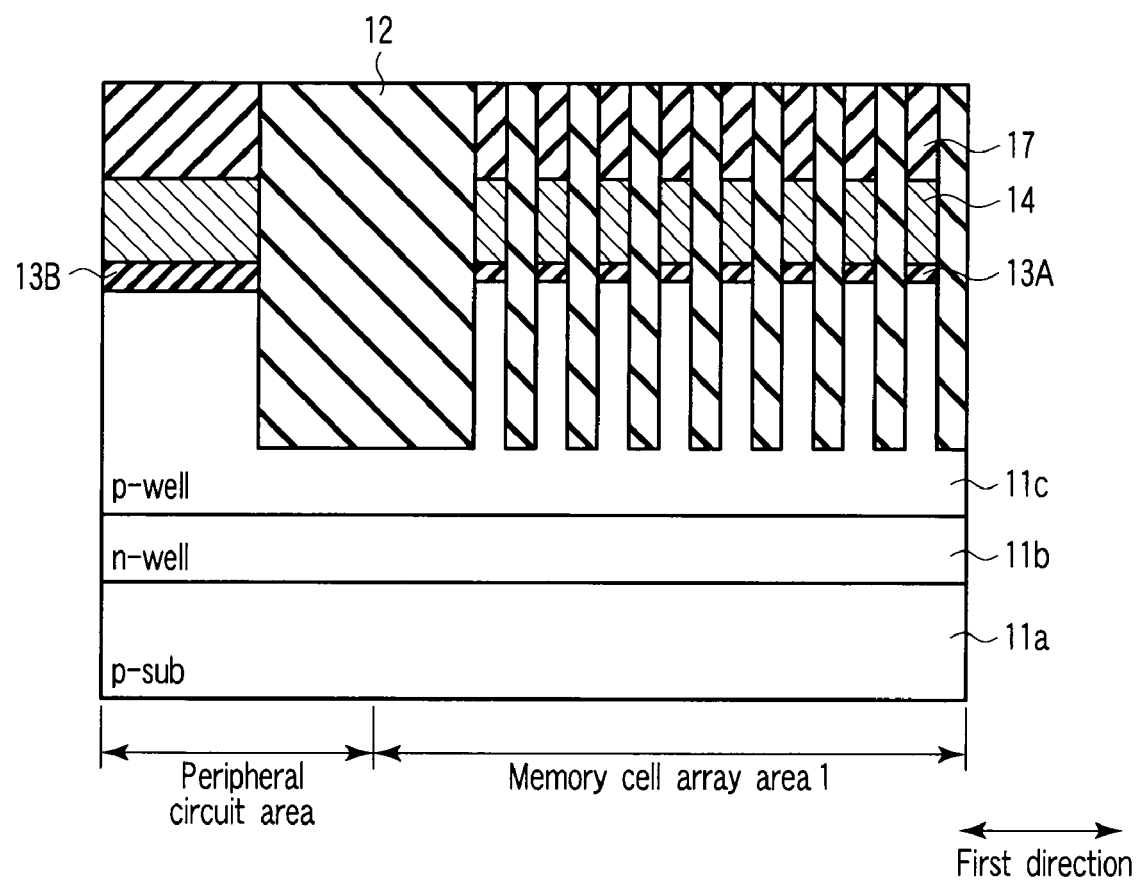
F I G. 18

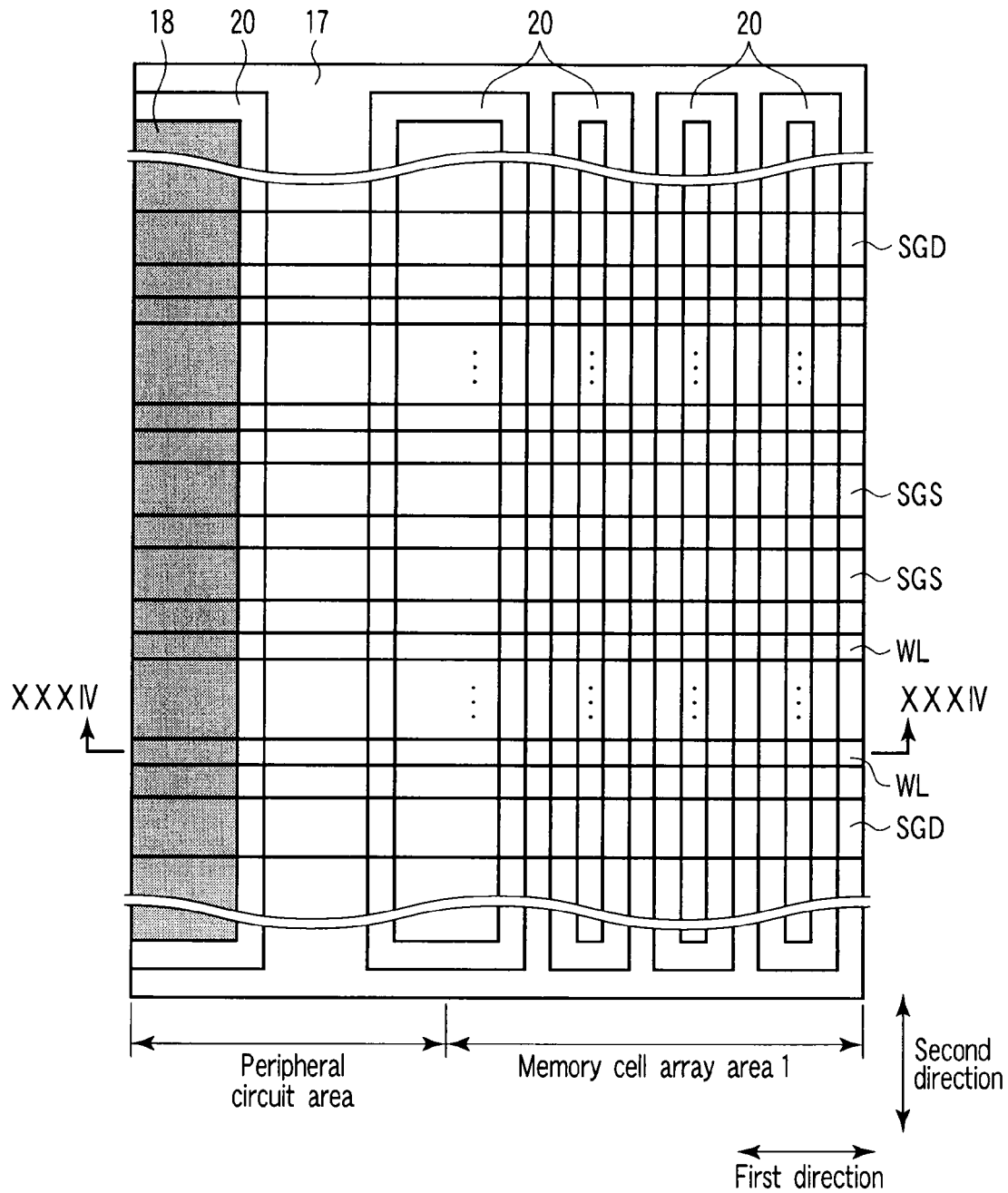
F I G. 33

MONOS type memory cell
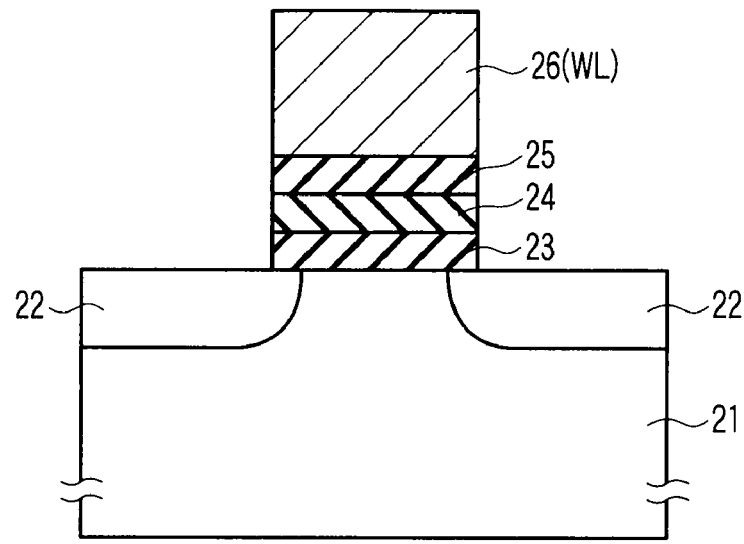
F I G. 46
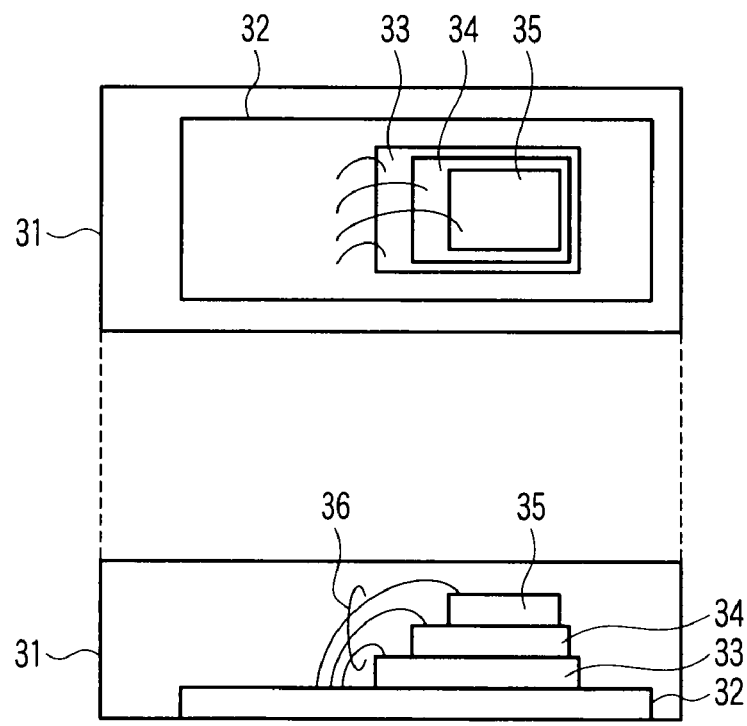
F I G. 47

SEMICONDUCTOR MEMORY

CROSS-REFERENCE TO RELATED APPLICATIONS

This application is based upon and claims the benefit of priority from prior Japanese Patent Application No. 2007-222783, filed Aug. 29, 2007, the entire contents of which are incorporated herein by reference.

BACKGROUND OF THE INVENTION

1. Field of the Invention

The present invention relates to an active area structure of a memory cell array.

2. Description of the Related Art

In recent years, many electronic devices which use NAND type flash memories have been commercially available. On the other hand, a large memory capacity of the NAND type flash memories is required due to multi-functions of the electronic devices, and thus the compatibility between shrink of memory cells and improvement in reliability becomes a problem (for example, see Jpn. Pat. Appln. KOKAI Publication Nos. 2002-184875, 5-88375 and 8-55920).

For example, a memory cell array of the NAND type flash memories has a periodical structure in which active areas and element isolation areas are arranged alternately with a constant spacing (for example, feature size). Further, when such a periodical structure is formed by using a conventional lithography technique, after an exposure margin (pattern blur) is taken into consideration, at least an active area at the endmost portion of the memory cell array is set as a dummy area and the width of the dummy area is made to be wider than the constant width.

A dummy cell which does not function as the memory cell but has a similar structure to that of the memory cell, is formed in the dummy area. In this case, when a writing potential is applied to a word line shared by the dummy cell and the memory cell, an electric field applied to an inter-electrode insulating film (or block insulating film) of the dummy cell becomes higher than an electric field applied to an inter-electrode insulating film (or block insulating film) of the memory cell.

The inter-electrode insulating film (or block insulating film) of the dummy cell is, therefore, easily broken by the writing potential, and this happens, the memory cell which shares the word line with the broken dummy cell will not function.

Such a problem arises not only in NAND type flash memories but also in other semiconductor memories where a large memory capacity is required.

BRIEF SUMMARY OF THE INVENTION

A semiconductor memory according to an aspect of the invention comprises active areas, and element isolation areas which isolate the active areas. The active areas and the element isolation areas are arranged alternately in a first direction. An n-th (n is odd number) active area from an endmost portion in the first direction and an (n+1)-th active area are coupled to each other at an endmost portion in a second direction perpendicular to the first direction.

BRIEF DESCRIPTION OF THE SEVERAL VIEWS OF THE DRAWING

FIGS. 2A and 2B are diagrams showing a basic structure of the present invention;

FIG. 18 is a cross-sectional view taken along line XVIII-XVIII of FIG. 17;

FIG. 33 is a plan view showing one step of the manufacturing method;

FIG. 46 is a diagram showing a MONOS type memory cell as the modification example;

FIG. 47 is a diagram showing a system as an application example;

DETAILED DESCRIPTION OF THE INVENTION

A semiconductor memory of an aspect of the present invention will be described below in detail with reference to the accompanying drawings.

1. Outline

An example of the present invention relates to a periodical structure where active areas and element isolation areas are arranged alternately in a first direction. This example adopts a layout where an n-th (n is odd number) active area from the endmost portion in the first direction and an (n+1)-th active area are coupled to each other at the endmost portion in a second direction perpendicular to the first direction.

The active areas having such a layout are called closed-loop structured active areas. The term closed loop refers to a perfect loop, and the opposite to a closed-loop structure is an open-loop structure. An open loop means that part of the loop is cut (open).

The closed-loop structure is realized by a side wall patterning technique.

The side wall patterning technique is a technique for forming patterns which are finer than a limit of resolution by means of photolithography.

When the side wall patterning technique is used, an exposure margin (pattern blur) of the photolithography does not have to be taken into consideration. For this reason, widths of all the active areas (including dummy area) in the memory cell array area in the first direction can be set to a constant width which is narrower than the limit of resolution by means of photolithography.

When a first active area from the endmost portion in the first direction is set as the dummy area, an electric field to be applied to an inter-electrode insulating film (or block insulating film) of the dummy cell in the dummy area is the same as an electric field to be applied to an inter-electrode insulating film (or block insulating film) of the memory cell. For this reason, breakage of the dummy cell can be prevented.

As a result, miniaturization and improvement in reliability of the memory cell can be realized at the same time.

2. Basic Structure

A basic structure of the active areas in the semiconductor memory according to the present invention will be described.

Figure 1:
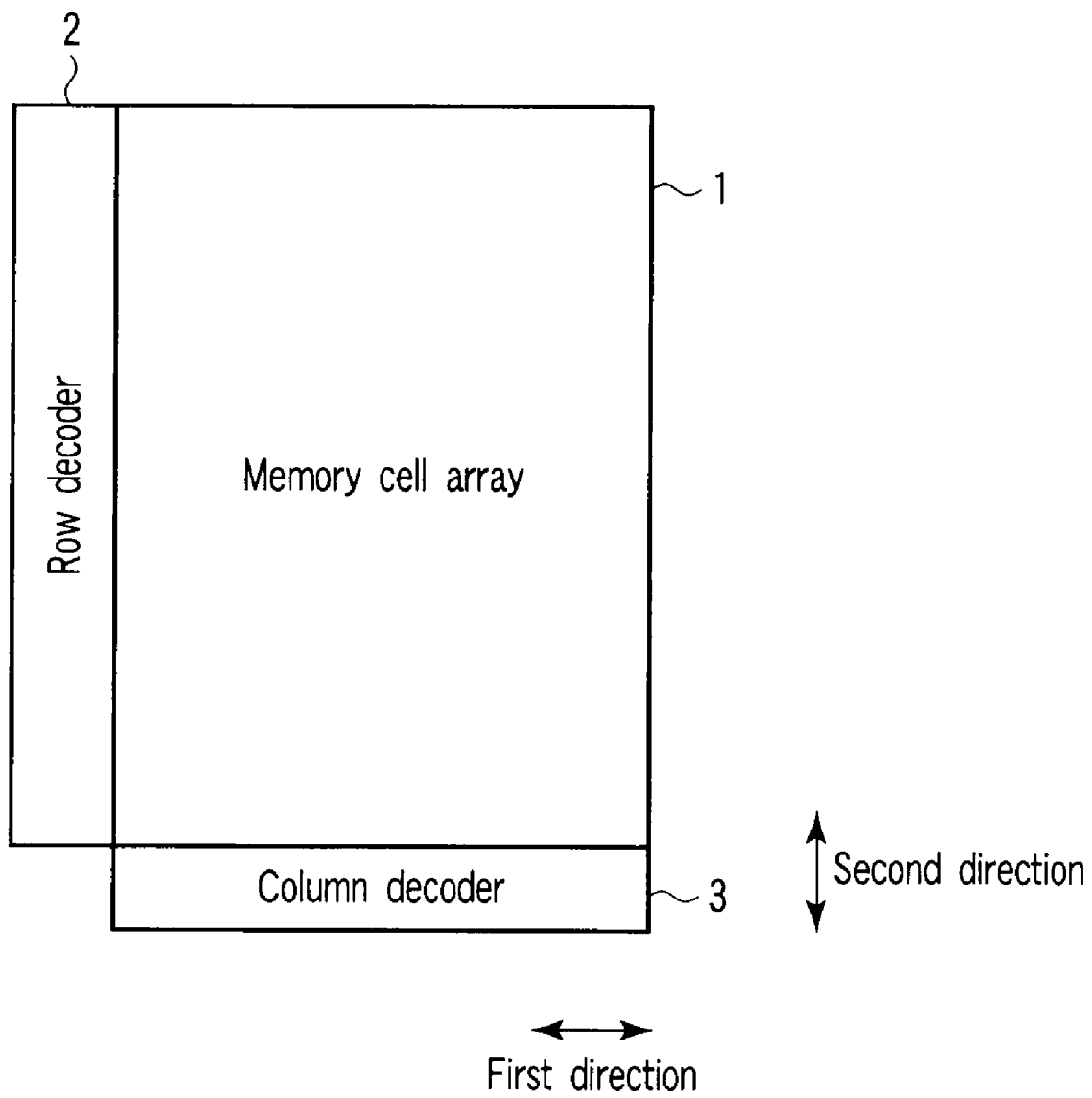
FIG. 1 is a diagram showing a positional relationship of a memory cell array.

As shown in FIG. 1, as to a positional relationship of a memory cell array area 1, a row decoder (word line driver) 2 is arranged at an endmost portion of the memory cell array area 1 in the first direction, and a column decoder (sense amplifier) 3 is arranged at an endmost portion of the memory cell array area 1 in a second direction perpendicular to the first direction.

As shown in FIGS. 2A and 2B, a periodical structure is such that active areas AA1, AA2, . . . and element isolation areas (areas other than the active areas AA1, AA2, . . . ) are arranged alternately in the first direction. Further, a closed-loop structure is formed in such a manner that an n-th (n is an odd number) active area AAn from the endmost portion in the first direction and an (n+1)-th active area AAn+1 are coupled to each other at the endmost portion in the second direction.

In FIG. 2A, the closed-loop structured active areas AA1, AA2, . . . are formed only in the memory cell array area 1. A MOS transistor constituting a row decoder is formed in the active areas AA (peripheral) in a peripheral circuit area.

When the first active area AA1 from the endmost portion in the first direction is set as a dummy area where a dummy cell which does not function as a memory cell is formed, a width of the dummy area in the first direction is the same as a width of the active areas AA2, AA3, . . . where the memory cells are formed in the first direction.

That is, since the memory cell and the dummy cell have the same structure and the same size, a problem such that the dummy cell is broken by an electric potential applied to the word line and thus the reliability is deteriorated can be prevented.

The closed-loop structured active areas (including dummy area) AA1, AA2, . . . are formed by a side wall patterning technique. According to the side wall patterning technique, the widths of all the active areas AA1, AA2, in the first direction can be uniform widths which are narrower than a limit of resolution by means of photolithography.

In FIG. 2B, m-th (m=2) and subsequent active areas AA2, AA3, . . . from the endmost portion of the closed-loop structured active areas (including dummy area) AA1, AA2, . . . in the first direction are formed in the memory cell array area 1, and the active area AA1 before m-th one from the endmost portion in the first direction is formed in the peripheral circuit area.

m=2, but m may be any number which is not less than 2.

In this case, a first gate insulating film of the MOS transistor is formed on the active areas AA2, AA3, . . . , and a second gate insulating film of the MOS transistor is formed on the active area AA1. The second gate insulating film is thicker than the first gate insulating film.

Similarly to the active area AA1, the second gate insulating film is formed on the active area AA (peripheral) in the peripheral circuit area.

That is, since the second gate insulating film, which is thicker than the first gate insulating film, is formed on the first active area AA1 from the endmost portion in the first direction, the MOS transistor having the second gate insulating film is hardly broken. As a result, the reliability is improved.

The active areas (including the dummy area) AA1, AA2, . . . having the closed-loop structure are formed by the side wall patterning technique. According to the side wall patterning technique, the widths of all the active areas AA1, AA2, . . . in the first direction can be a uniform width which is narrower than the limit of resolution by means of photolithography.

Since the active area AA1 is formed in the peripheral circuit area, the width of the element isolation area between the active areas AA1 and AA2 in the first direction is wider than the width of the active areas AA1, AA2, . . . in the first direction.

The widths of the other element isolation areas constituting the periodical structure in the first direction are the same as the widths of the active areas AA1, AA2, . . . , for example.

That is, the widths of the element isolation areas on the end of the periodical structure are wider than that on the center of the periodical structure.

3. EXAMPLES

Examples of the present invention will be described by exemplifying a NAND type flash memory.

(1) First Example

A. Structure

Figure 3:
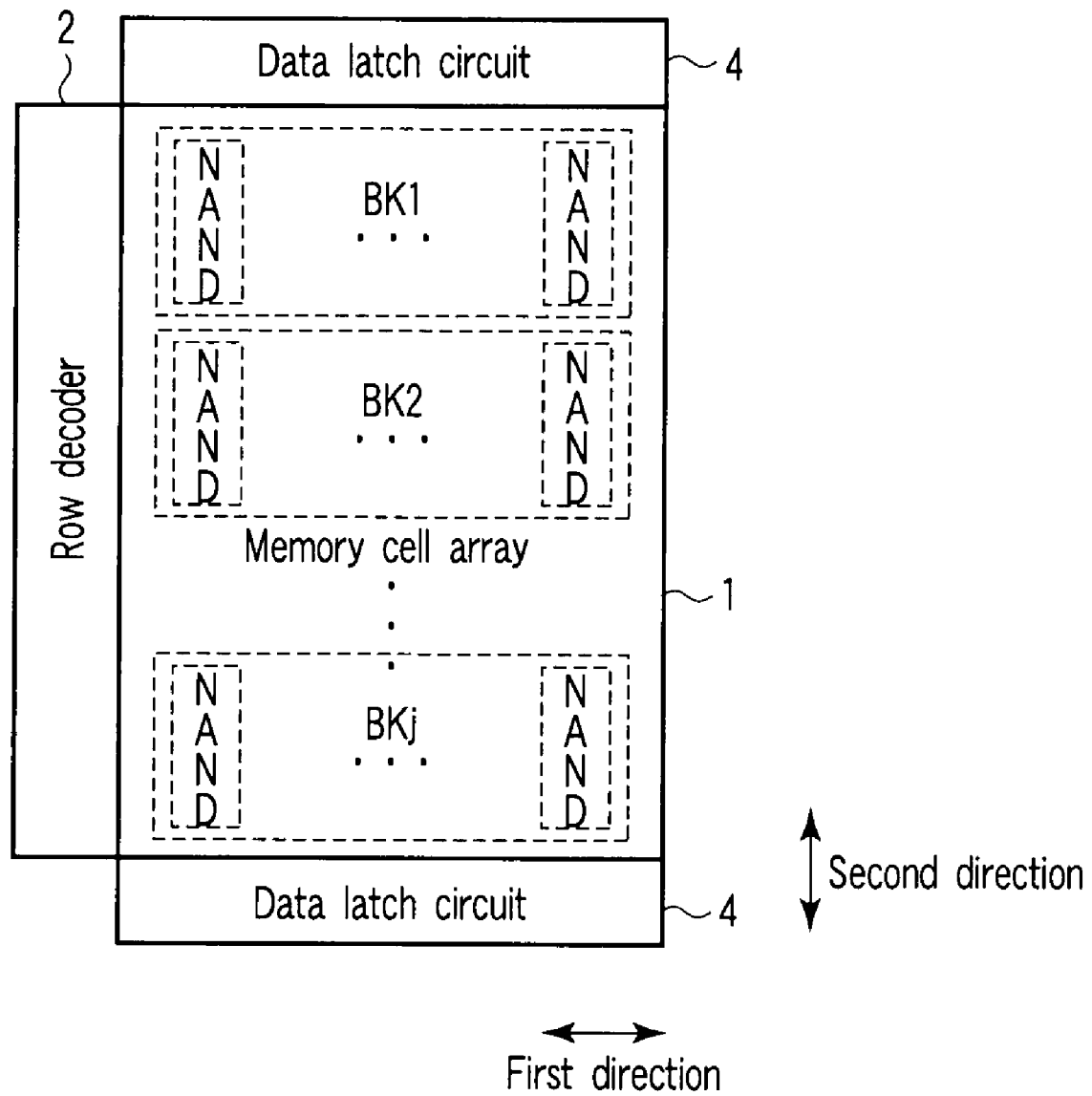
FIG. 3 is a diagram showing a NAND type flash memory.

FIG. 3 shows a main section of the NAND type flash memory.

j (j is any number not less than 2) blocks BK1, BK2, . . . , BKj are arranged in the second direction in the memory cell array 1. The blocks BK1, BK2, . . . , BKj have a plurality of NAND cell units which are arranged in the first direction, respectively.

The row decoder (word line driver) 2 selects selected one word line in selected one block BKi (i is one of 1 to j) at the time of reading/writing.

A data latch circuit 4 has a function for temporarily latching data at the time of reading/writing. The data latch circuit 4 is arranged on both endmost portions of the memory cell array area 1 in the second direction. This layout is effective for an ABL (all bit line) sense principle.

Figure 4:
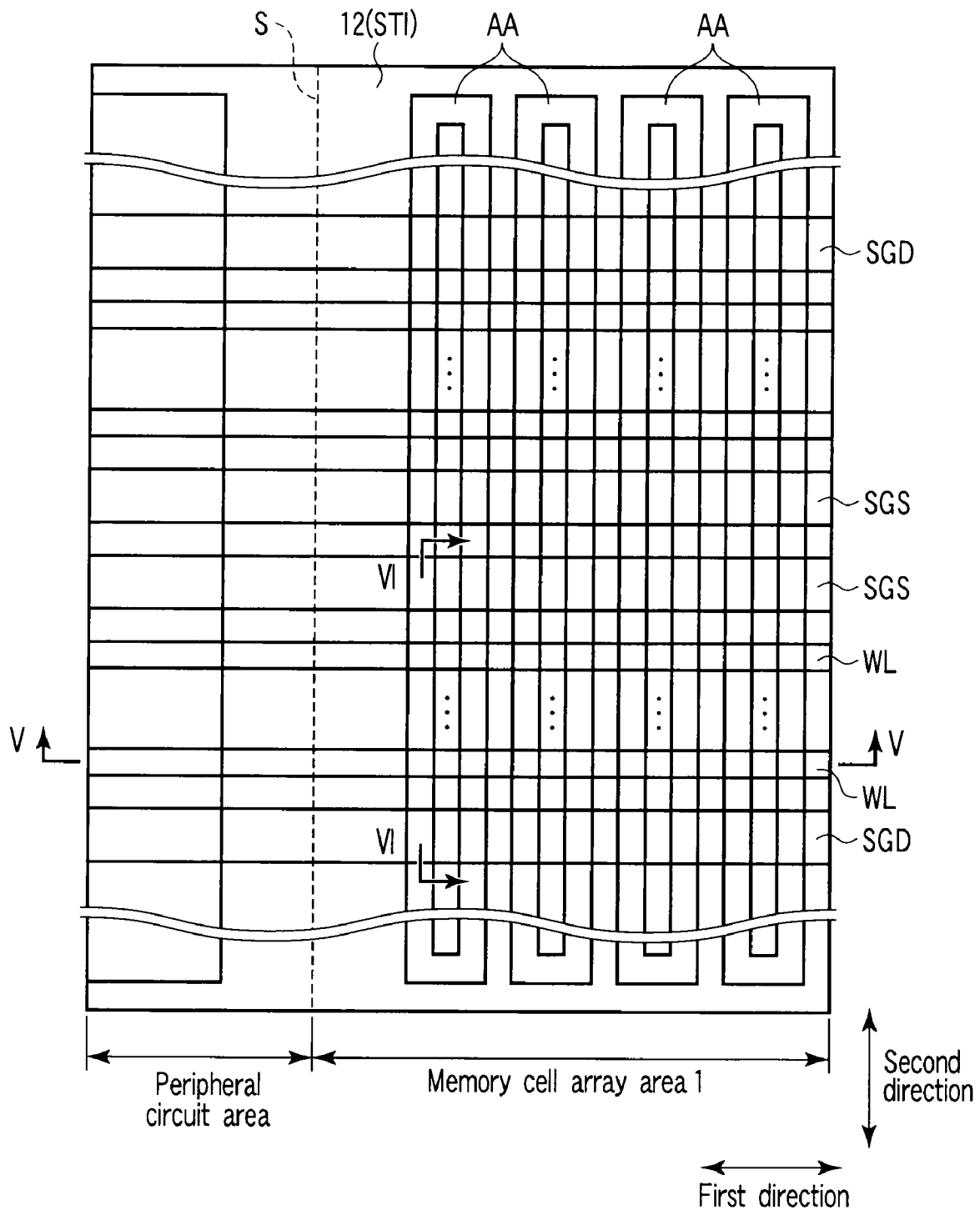
FIG. 4 is a plan view showing a layout of a closed-loop structured active area.
Figure 5:
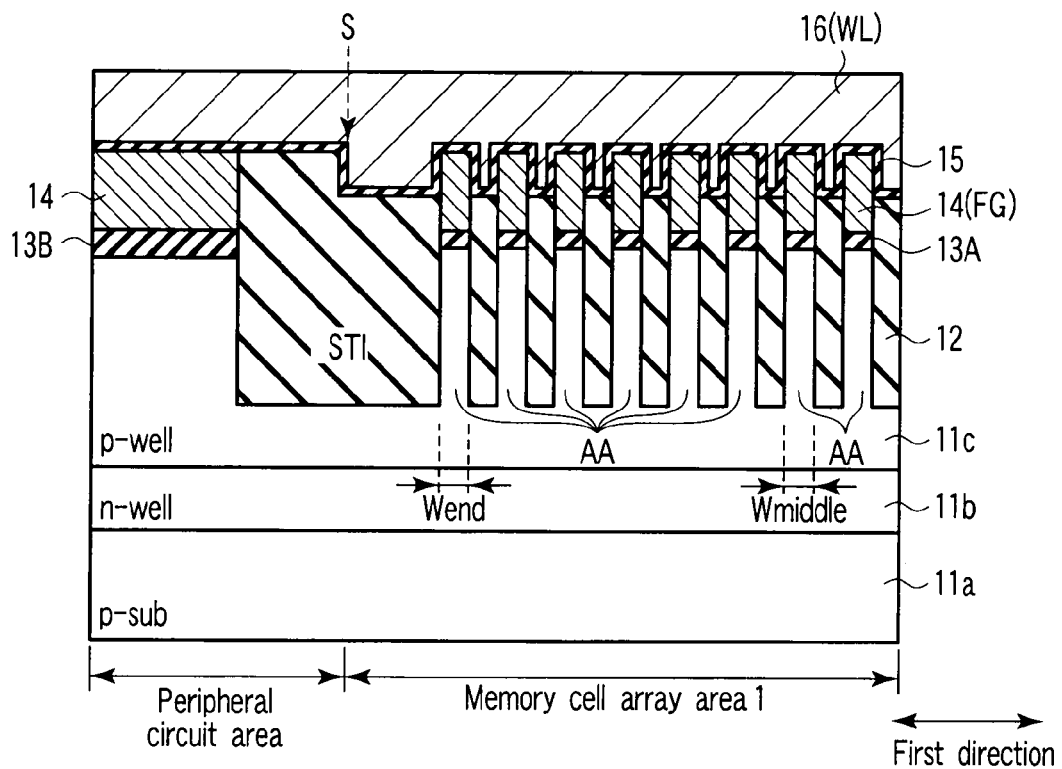
FIG. 5 is a cross-sectional view taken along line V-V of FIG. 4.
Figure 6:
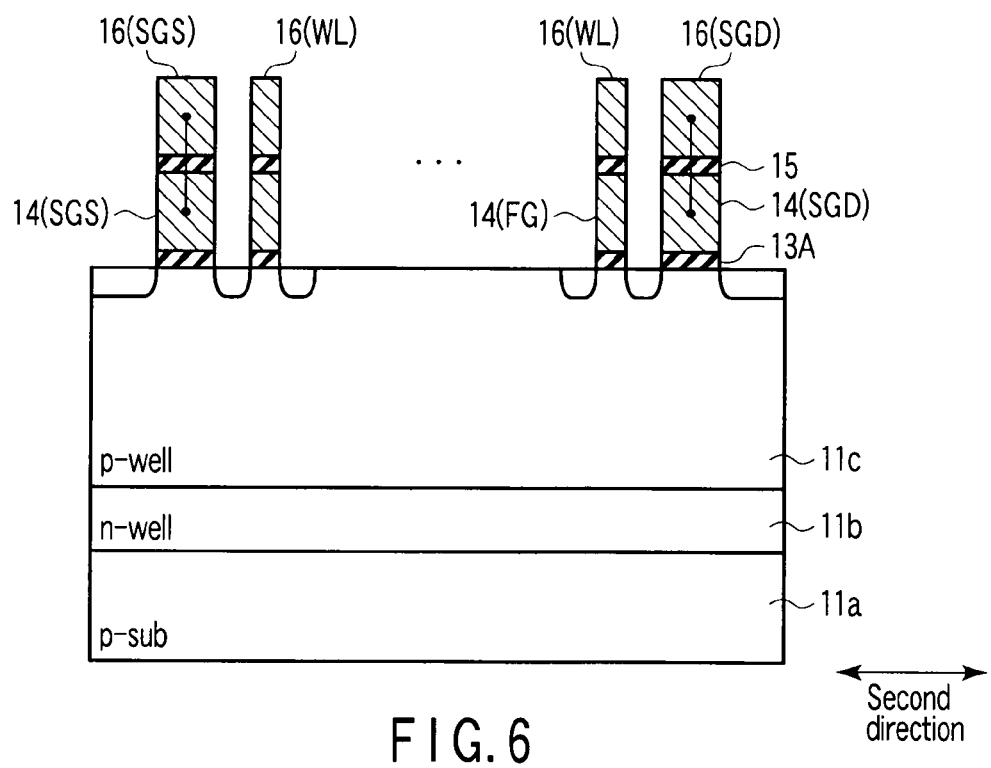
FIG. 6 is a cross-sectional view taken along line VI-VI of FIG. 4.

FIG. 4 is a plan view showing the memory cell array area. FIG. 5 is a cross-sectional view taken along line V-V of FIG. 4, and FIG. 6 is a cross-sectional view taken along line VI-VI of FIG. 4.

A double well region which includes an n-type well region (n-well) 11b and a p-type well region (p-well) 11c is formed in a p-type semiconductor substrate (p-sub) 11a.

The active areas AA and the element isolation areas (the areas other than the active areas AA) are arranged alternately in the first direction in the memory cell array area 1 so as to form the periodical structure. The n-th (n is an odd number) active area AA from the endmost portion in the first direction and the (n+1)-th active area AA are coupled with each other at the endmost portion in the second direction so as to form the closed-loop structure.

A floating gate electrode 14 (FG) and lower gate electrodes 14 (SGS) and 14 (SGD) are formed on the active areas AA via a gate insulating film (tunnel insulating film) 13A. The floating gate electrode 14 (FG) and the lower gate electrodes 14 (SGS) and 14 (SGD) are composed of, for example, a conductive polysilicon layer.

A conductive layer 14 which is composed of the same material as that of the floating gate electrode 14 (FG) is formed on the active area AA in the peripheral circuit area via a gate insulating film 13B thicker than the gate insulating film 13A.

An element isolation insulating film 12 having an STI (shallow trench isolation) structure is formed in the element isolation areas. An upper surface of the element isolation insulating film 12 is flat, and has a step S on the outside of the periodical structure of the active area AA and the element isolation area, for example, between the memory cell array area 1 and the peripheral circuit area.

As to the step S, the upper surface of the element isolation insulating film 12 in the portion of the periodical structure is low.

As a result, a part of the side surface of the floating gate 14 (FG) on the active area AA in the memory cell array area 1 is exposed from the element isolation insulating film 12.

A control gate electrode (word line) 16 (WL) is formed on the element isolation insulating film 12, the floating gate electrode 14 (FG) and the conductive layer 14 via an inter-electrode insulating film (for example, an ONO film, a high-dielectric-constant material or the like) 15.

The control gate electrode 16 (WL) extends in the first direction across the memory cell array area 1 and the peripheral circuit area. The control gate electrode 16 (WL) can have a multi-layered structure, for example, a laminated structure of a conductive polysilicon layer and a silicide layer.

Upper gate electrodes (select gate lines) 16 (SGS) and 16 (SGD) are formed on the lower gate electrodes 14 (SGS) and 14 (SGD) via the inter-electrode insulating film 15. The lower gate electrodes 14 (SGS) and 14 (SGD) and the upper gate electrodes 16 (SGS) and 16 (SGD) are electrically connected.

Such a closed-loop structured active area AA is formed by the side wall patterning technique as mentioned later. According to the side wall patterning technique, the widths of all the active areas AA in the memory cell array area 1 in the first direction can be made uniform and narrower than the limit of resolution, by means of photolithography.

When the first active area AA from the endmost portion of the memory cell array area 1 in the first direction is set as the dummy area where the dummy cell which does not function as the memory cell is formed, a width (Wend) of the dummy area in the first direction is the same as a width (Wmiddle) in the first direction of the active areas AA where the memory cells are formed.

When the side wall patterning technique is used, the widths of all the active areas AA constituting the periodical structure basically become uniform. However, the uniform width includes a change in the widths due to patterning dispersion (margin of error).

For this reason, the memory cell and the dummy cell have the same structure and the same size. Specifically, a coupling ratio of the memory cell and a coupling ratio of the dummy cell are equal to each other.

Therefore, even if a writing potential is applied to the word line shared by the memory cell and the dummy cell, an electric field to be applied to the inter-electrode insulating film (or block insulating film) of the dummy cell is equal to an electric field to be applied to the inter-electrode insulating film (or block insulating film) of the memory cell. As a result, a problem such that the dummy cell is broken and the reliability is deteriorated can be prevented.

B. Manufacturing Method

The method for manufacturing the NAND type flash memory shown in FIGS. 4 to 6 will be described.

Figure 7:
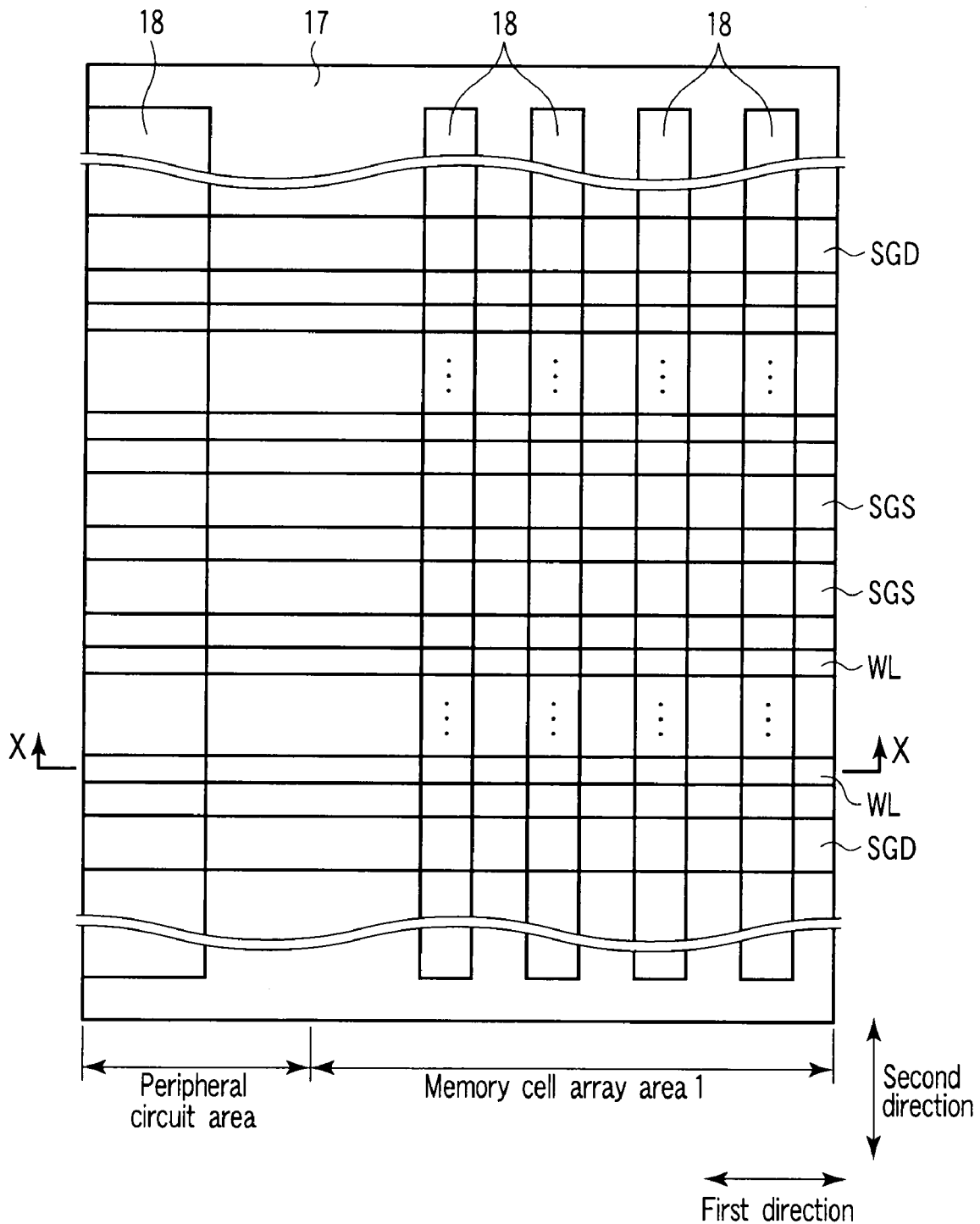
FIG. 7 is a plan view showing one step of a manufacturing method.
Figure 8:
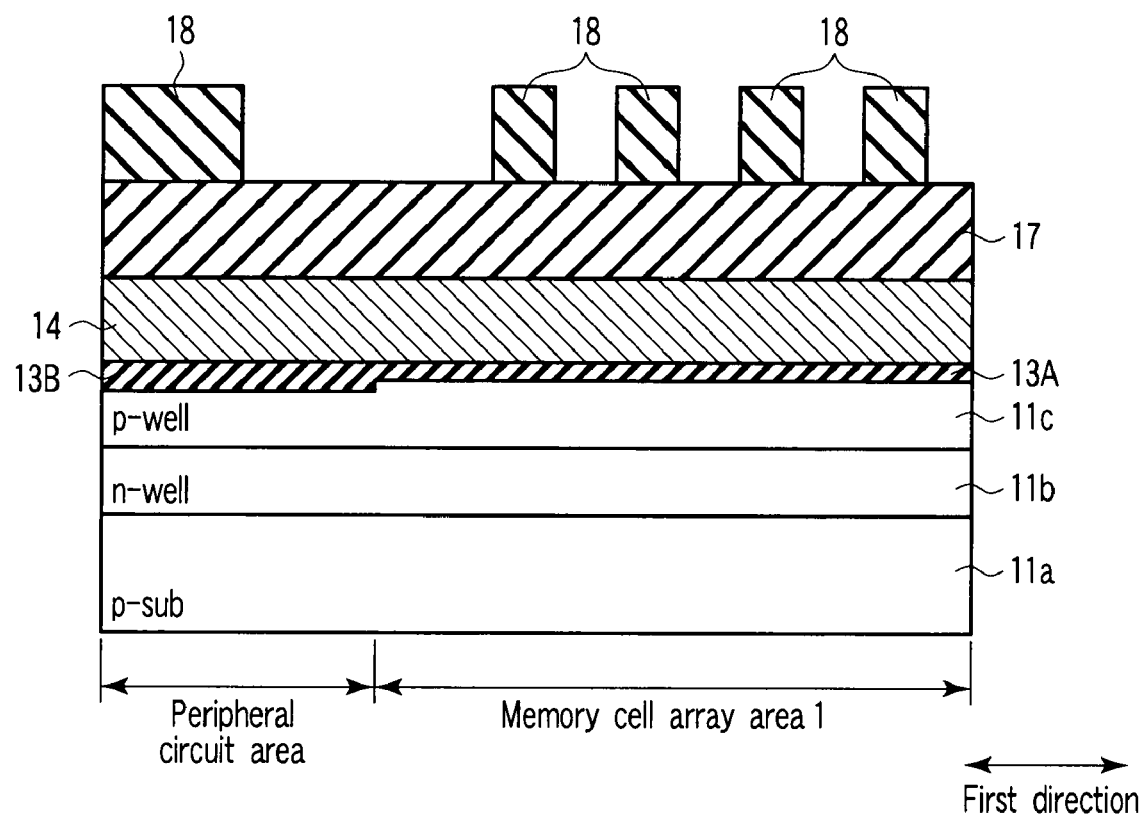
FIG. 8 is a cross-sectional view taken along line VIII-VIII of FIG. 7.

As shown in FIGS. 7 and 8, a double well region which includes the n-type well region 11b and the p-type well region 11c is formed in the p-type semiconductor substrate 11a.

The gate insulating film 13A is formed on the p-type well region 11c in the memory cell array area 1 by the thermal oxidation method. The gate insulating film 13B, which is thicker than the gate insulating film 13A, is formed on the p-type well region 11c in the peripheral circuit area.

Thereafter, a first mask layer 17 and a second mask layer 18 are sequentially formed on the gate insulating films 13A and 13B by the CVD method. The first mask layer 17 and the second mask layer 18 are made of different materials which have different etching rate.

Thereafter, a photoresist film 19 is formed on the second mask layer 18.

The photoresist film 19 is processed into a predetermined pattern by the photolithography process. For example, the photoresist film 19 is formed by a line and space pattern in the memory cell array area 1.

The pitch of the lines and spaces of the photoresist film 19 is set to a limit (feature size) of resolution of photolithography, for example, 120 nm (line width x=60 nm and space width x=60 nm).

The second mask layer 18 is etched by using the photoresist film 19 as a mask according to RIE, and then the photoresist film 19 is removed.

Figure 9:
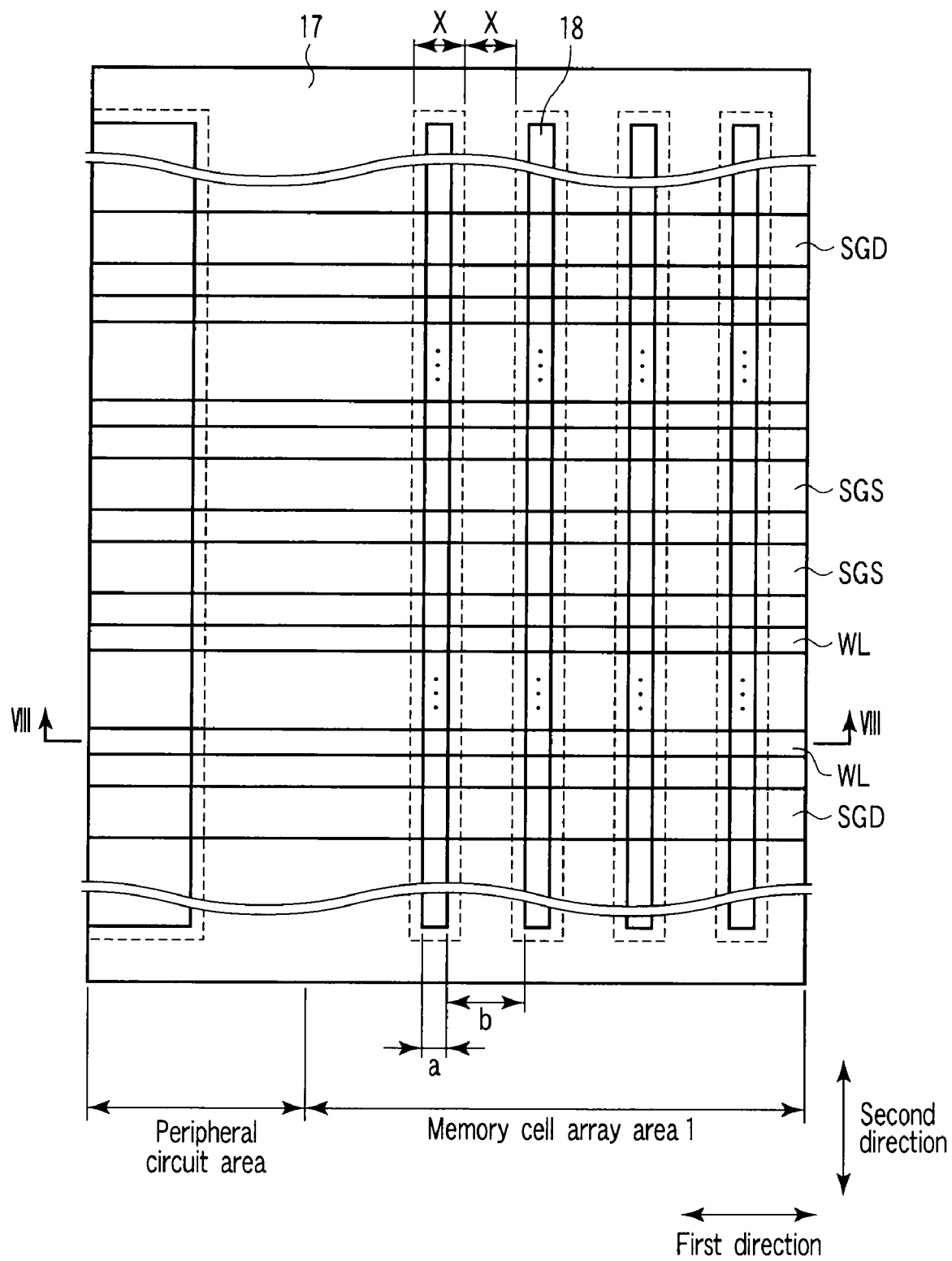
FIG. 9 is a plan view showing one step of the manufacturing method.
Figure 10:
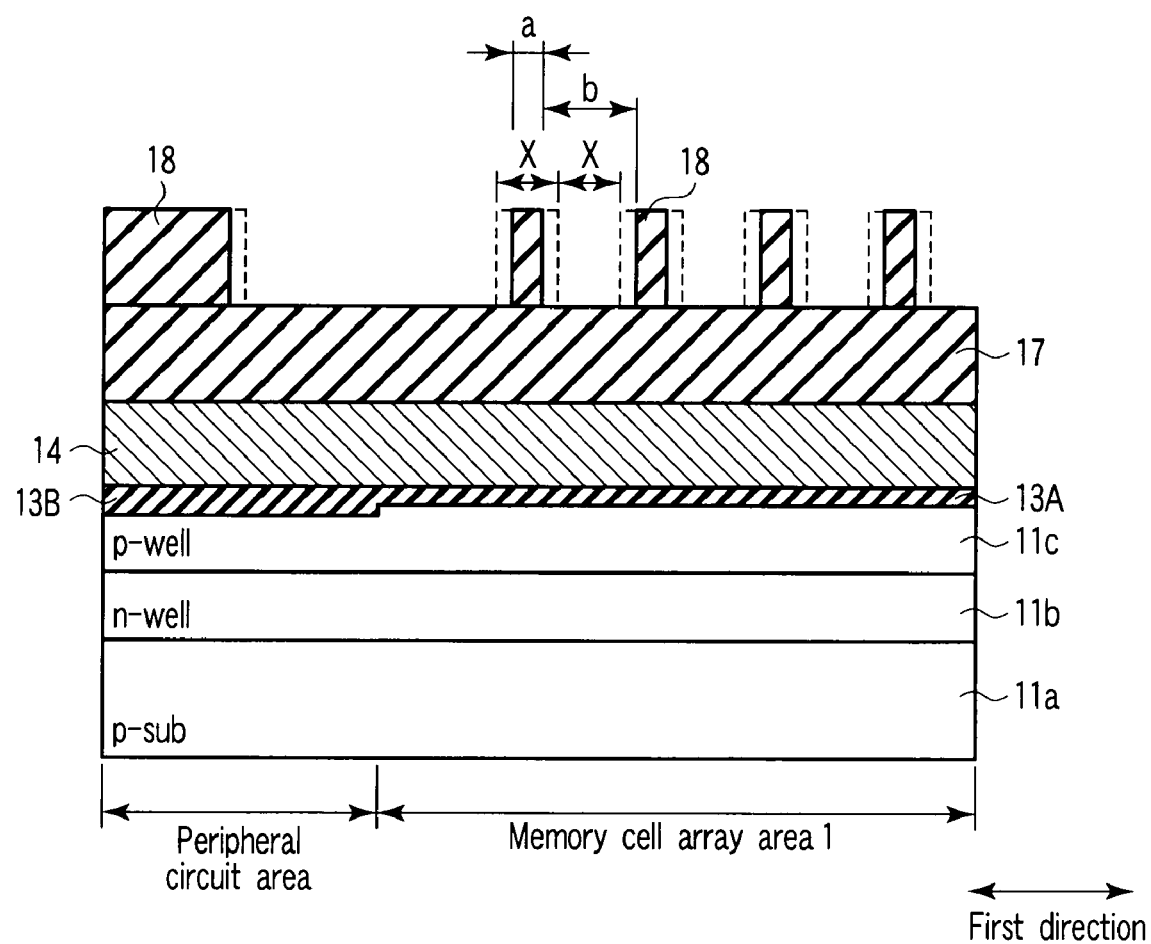
FIG. 10 is a cross-sectional view taken along line X-X of FIG. 9.

As a result, as shown in FIGS. 9 and 10, the pattern of the photoresist film 19 in FIGS. 7 and 8 is transferred onto the second mask layer 18.

In the memory cell array area 1, the width of the second mask layer 18 is made to be smaller than the limit of resolution of photolithography by a slimming technique. A dotted line in the cross-sectional view of FIG. 10 shows the pattern of the second mask layer 18 before slimming, and a solid line shows the pattern of the second mask layer 18 after slimming.

A line width (a) of the second mask layer 18 is set to 30 nm, and a space width (b) thereof is set to 90 nm by the slimming technique.

Figure 11:
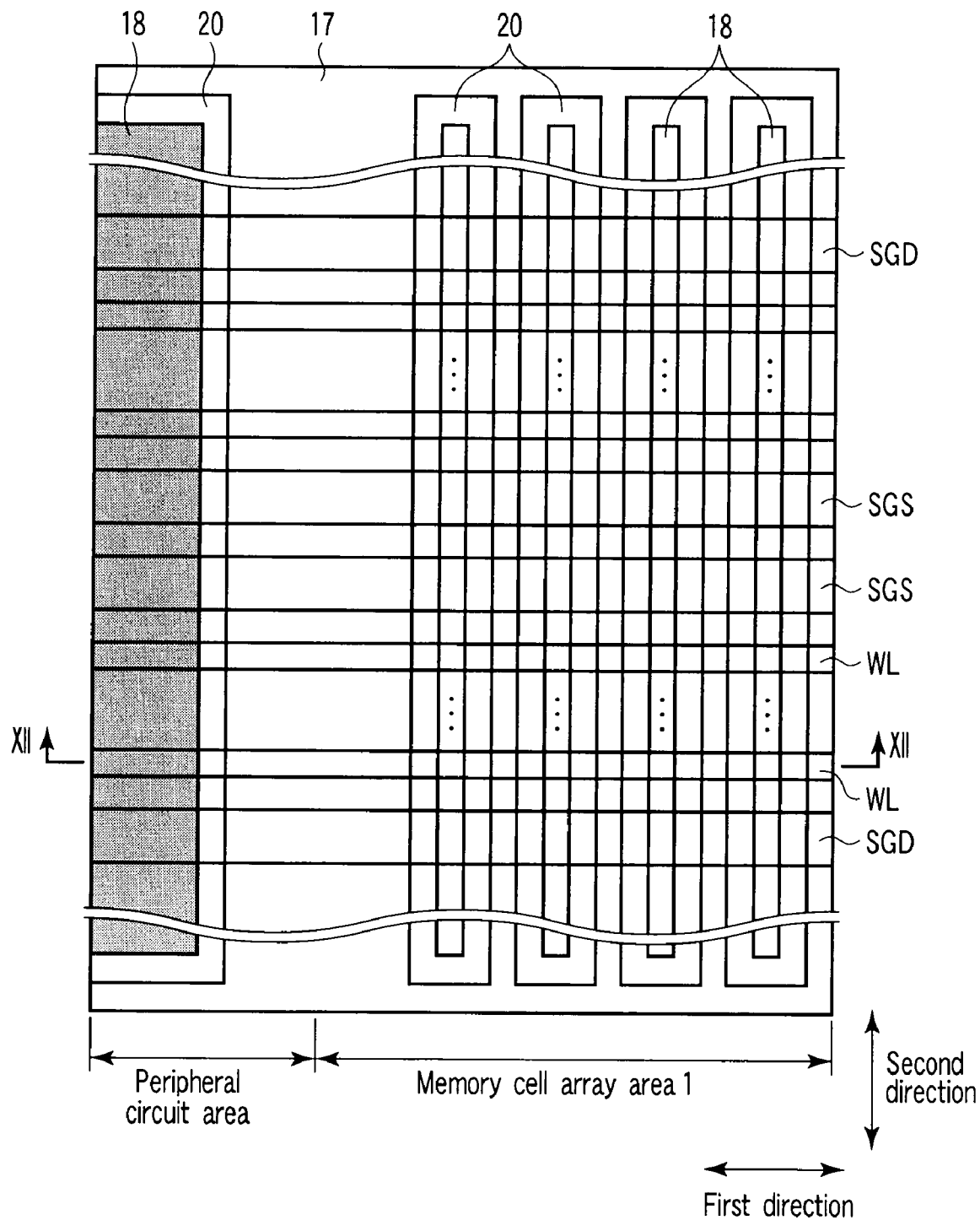
FIG. 11 is a plan view showing one step of the manufacturing method.
Figure 12:
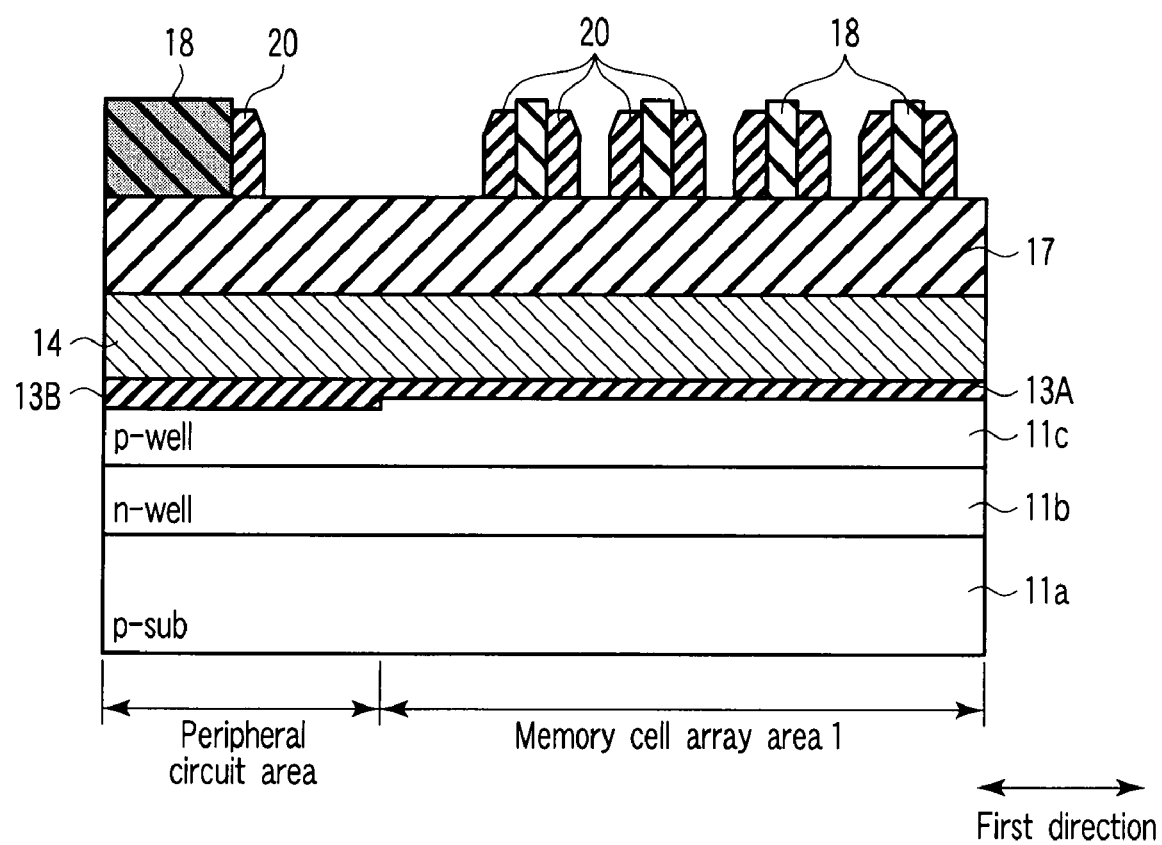
FIG. 12 is a cross-sectional view taken along line XII-XII of FIG. 11.

As shown in FIGS. 11 and 12, the second mask layer 18 in the peripheral circuit area is solidified. The etching selectivity of the solidified second mask layer 18 is sufficiently smaller than that of the unsolidified second mask layer 18 under the same etching condition. The solidified portion is shown in gray.

A third mask layer 20 is formed on the first mask layer 17 and the second mask layer 18 according to the CVD method, and the third mask layer 20 is made to remain only on a side wall portion of the second mask layer 18 by RIE.

The third mask layer 20 has a closed-loop shape which surrounds the second mask layer 18.

Both the width of the second mask layer 18 and the width of the third mask layer 20 are 30 nm. The width between the second and third mask layers 18 and 20 is, for example, 30 nm.

Figure 13:
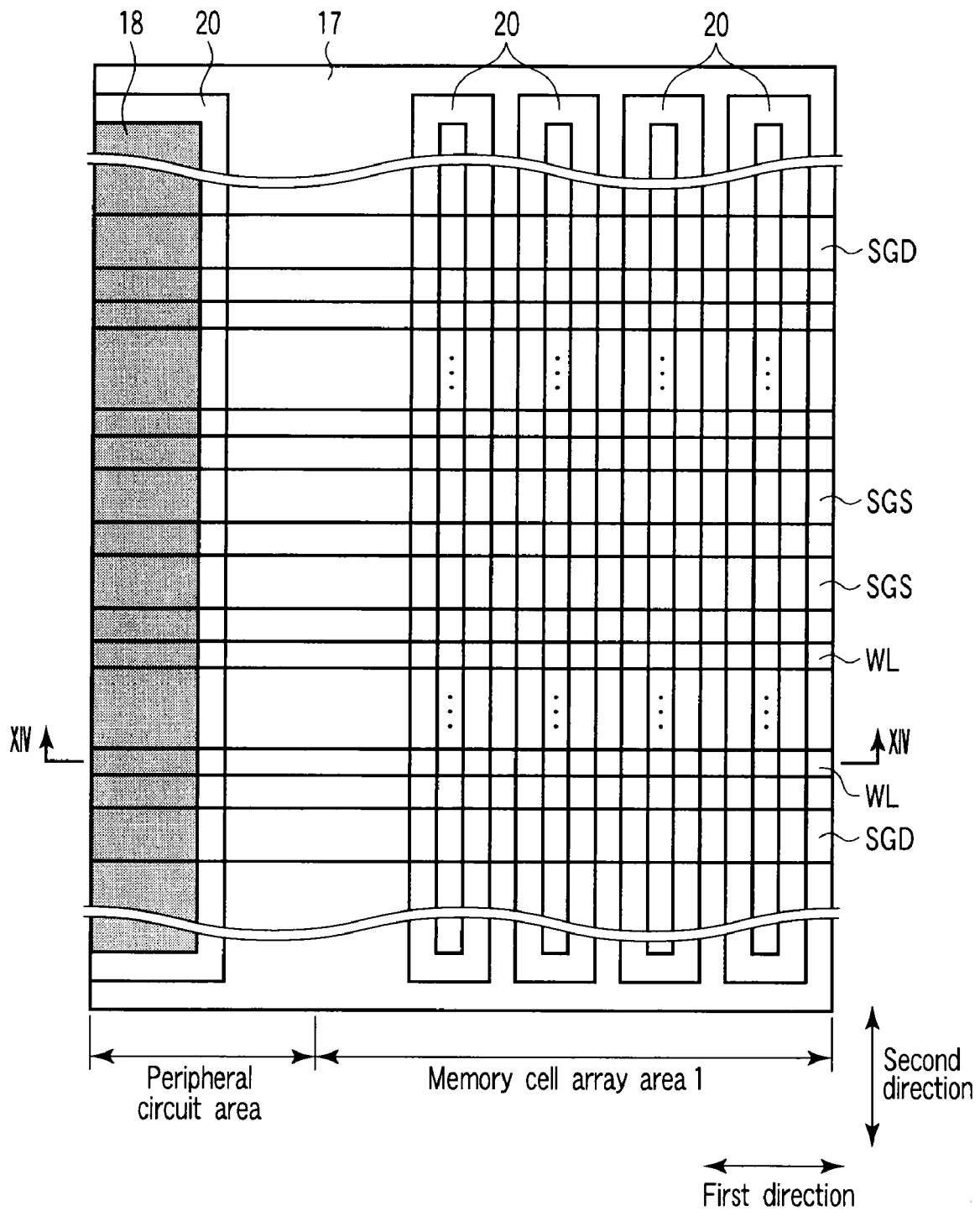
FIG. 13 is a plan view showing one step of the manufacturing method.
Figure 14:
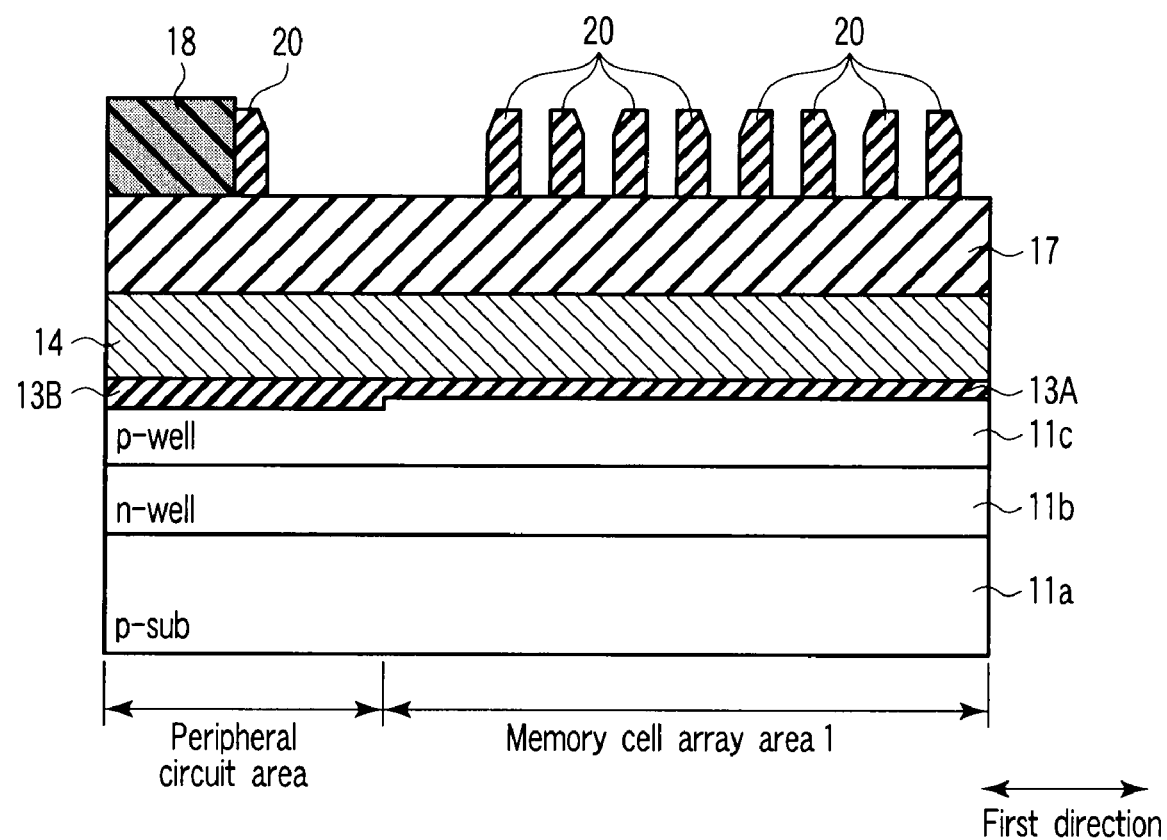
FIG. 14 is a cross-sectional view taken along line XIV-XIV of FIG. 13.

Thereafter, when only the unsolidified second mask layer 18 is removed, as shown in FIGS. 13 and 14, the line and space structure including the third mask layer (line width=30 nm) 20 and the space (space width=30 nm) is formed in the memory cell array area 1.

The first mask layer 17 is etched by using the solidified second mask layer 18 and the third mask layer 20 as a mask according to RIE. As a result, the patterns of the solidified second mask layer 18 and the third mask layer 20 are transferred onto the first mask layer 17.

As a result, a fine pattern of the first mask layer 17 is formed by the side wall patterning technique.

This pattern (line=30 nm, space=30 nm) is finer than the limit (feature size) of resolution of photolithography.

Thereafter, the solidified second mask layer 18 and the third mask layer 20 are removed.

Figure 15:
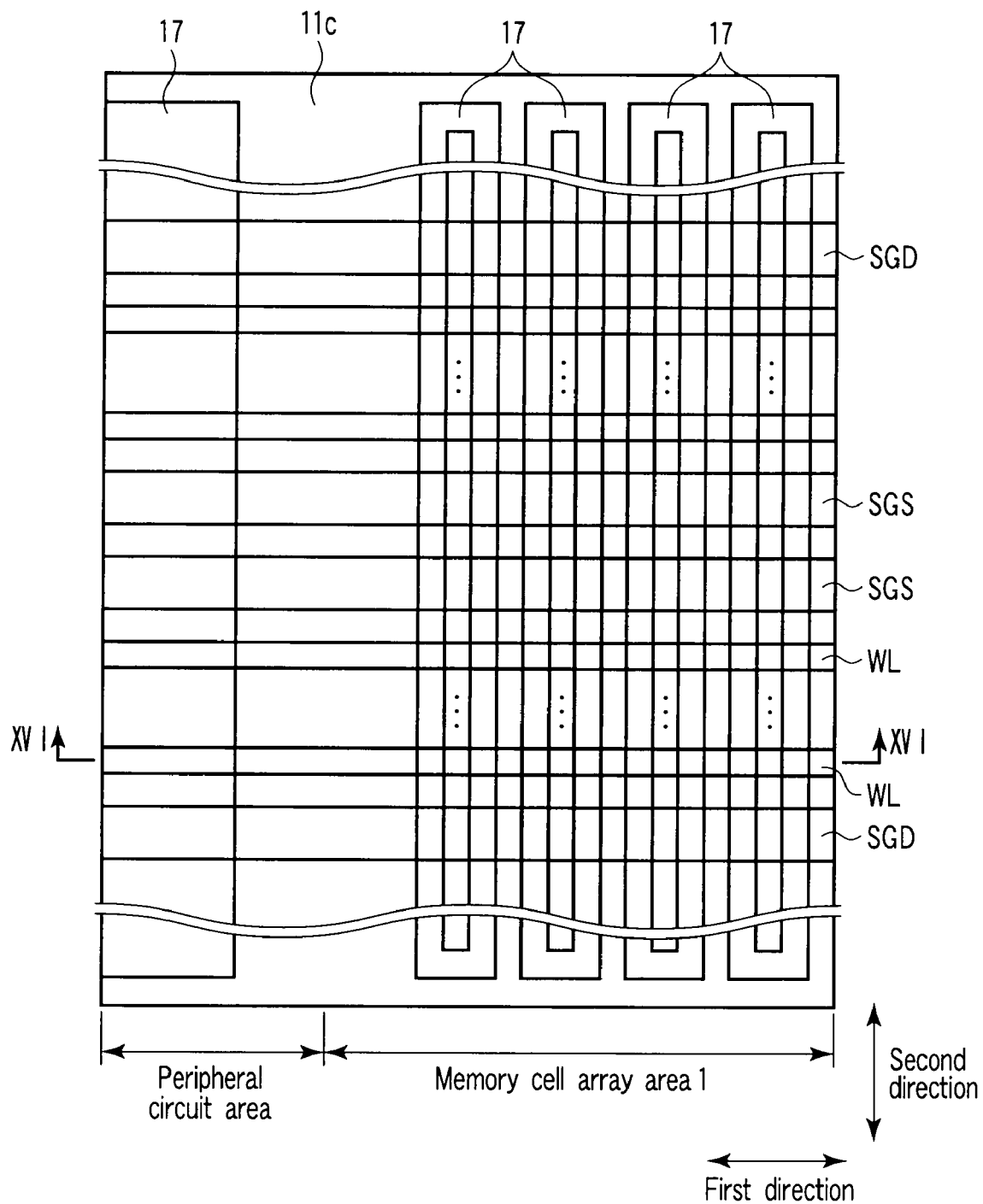
FIG. 15 is a plan view showing one step of the manufacturing method.
Figure 16:
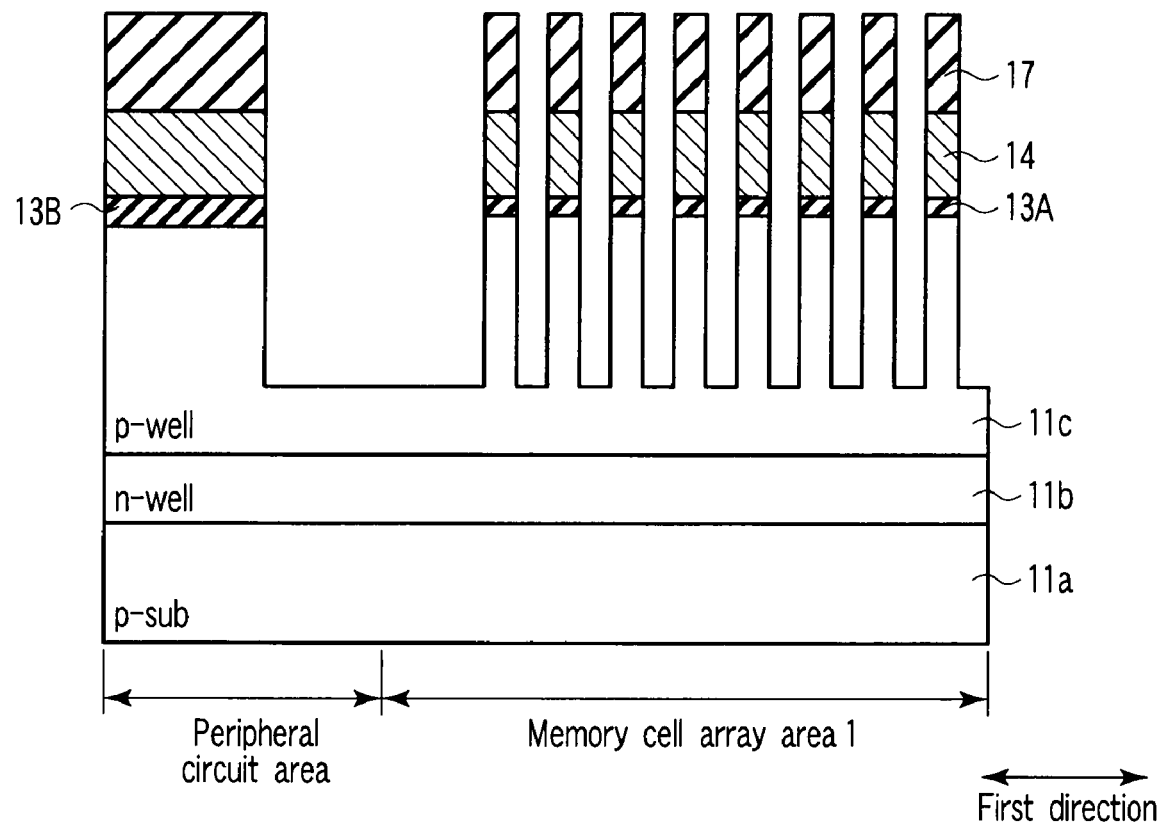
FIG. 16 is a cross-sectional view taken along line XVI-XVI of FIG. 15.

As shown in FIGS. 15 and 16, the conductive layer 14, the gate insulating films 13A and 13B, and the semiconductor substrate (including the n-type well region and the p-type well region) 11a are etched by using the first mask layer 17 as a mask according to RIE, so that a trench is formed.

Figure 17:
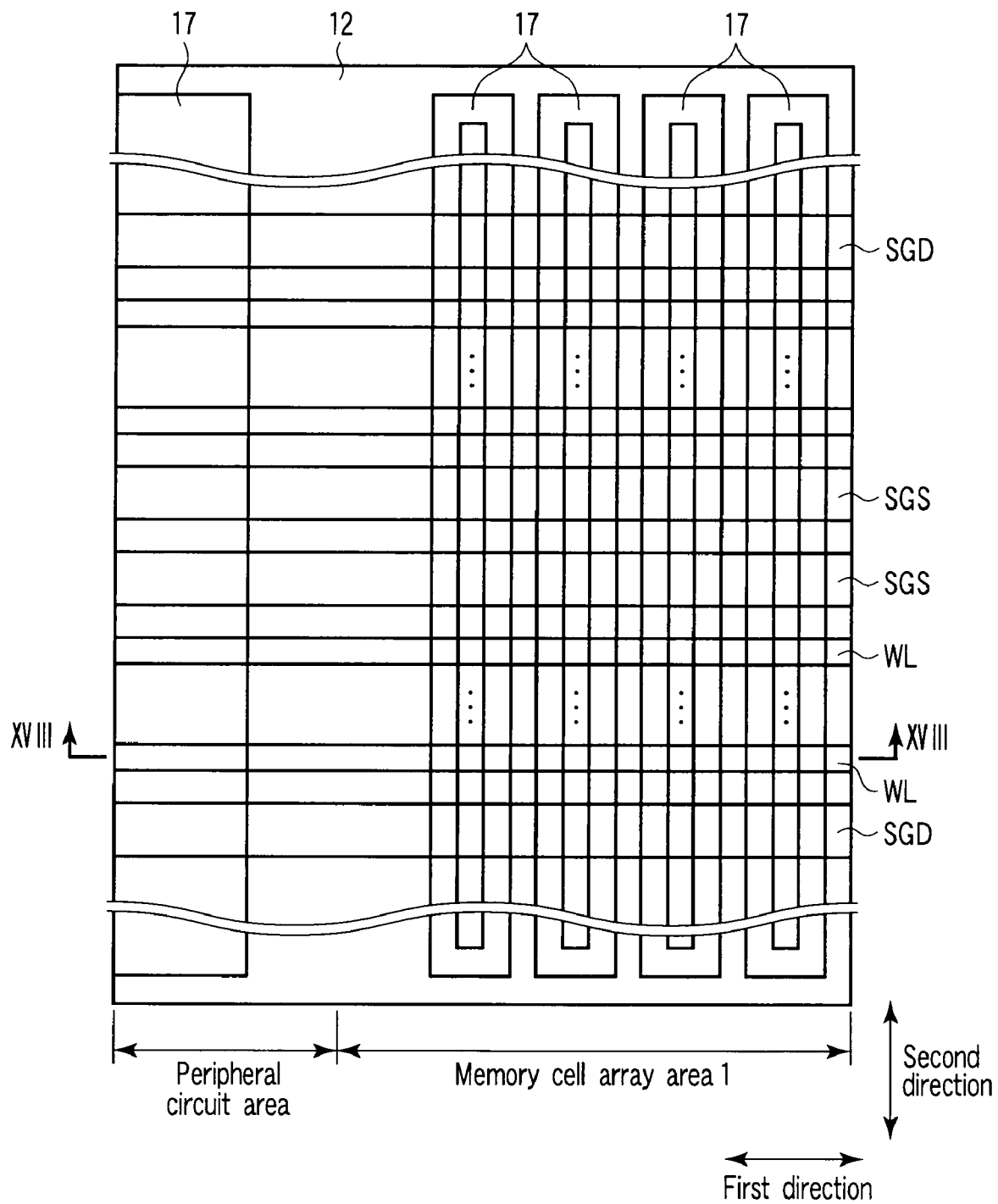
FIG. 17 is a plan view showing one step of the manufacturing method.

As shown in FIGS. 17 and 18, the trench is filled with the element isolation insulating film 12 according to the CVD method. The upper surface of the element isolation insulating film 12 is flattened by CMP (chemical mechanical polishing).

The upper surface of the element isolation insulating film 12 approximately matches the upper surface of the first mask layer 17.

Figure 19:
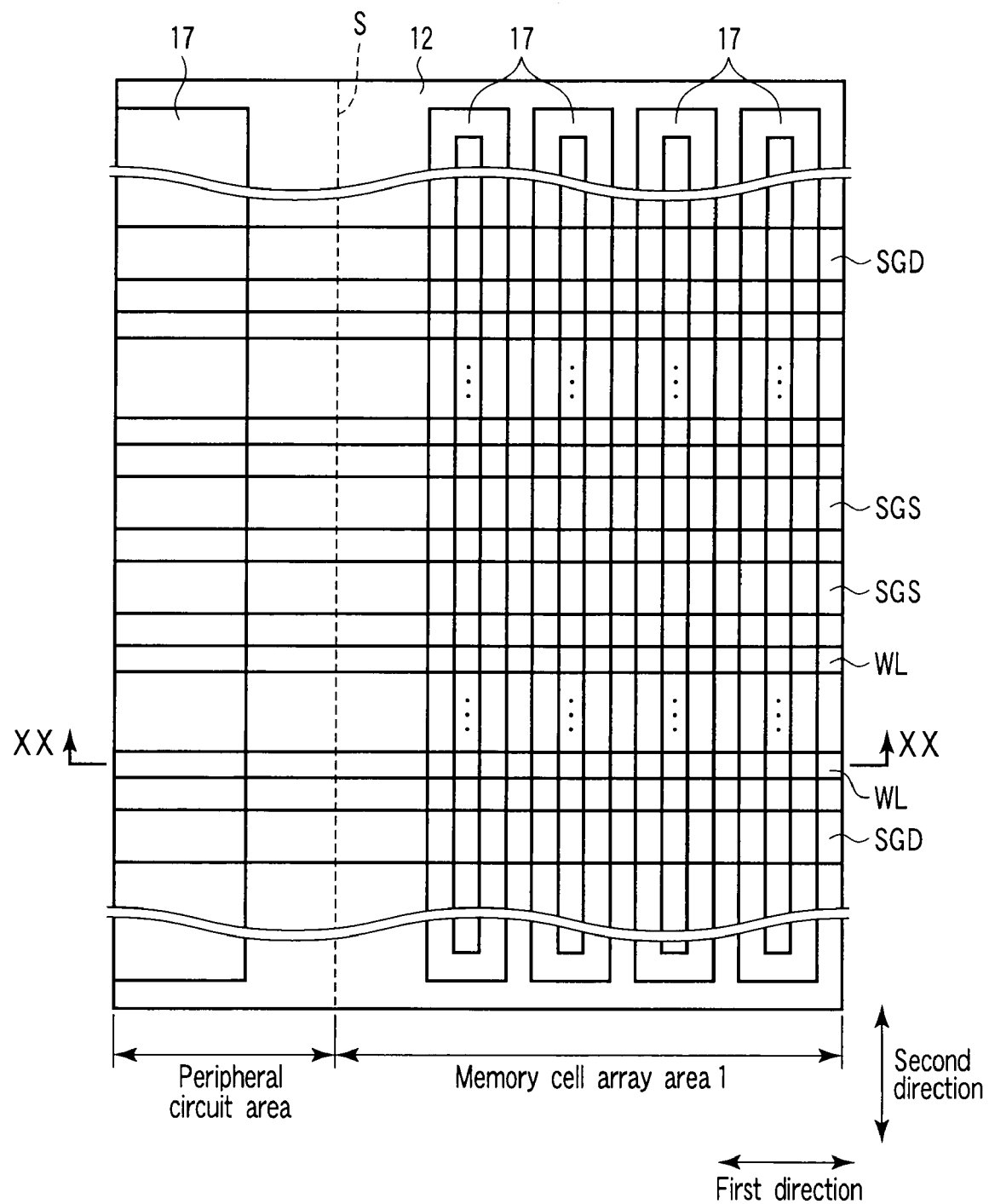
FIG. 19 is a plan view showing one step of the manufacturing method.
Figure 20:
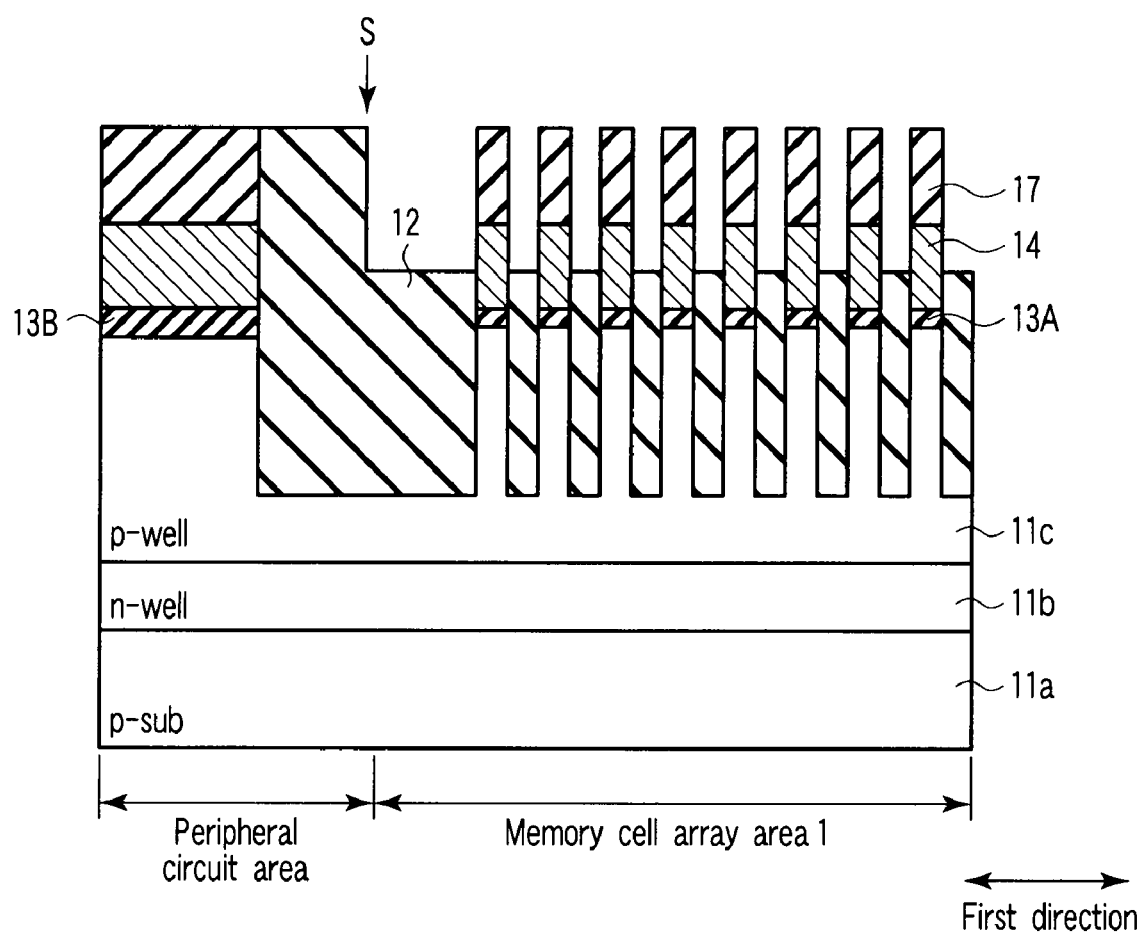
FIG. 20 is a cross-sectional view taken along line XX-XX of FIG. 19.

As shown in FIGS. 19 and 20, the element isolation insulating film 12 in the memory cell array area 1 is selectively etched, and a position of the upper surface of the element isolation insulating film 12 is lowered so that the side surface of the conductive layer 14 is partially exposed.

The side surface of the conductive layer 14 on all the active areas (including the dummy area) in the memory cell array area 1 is exposed.

Figure 21:
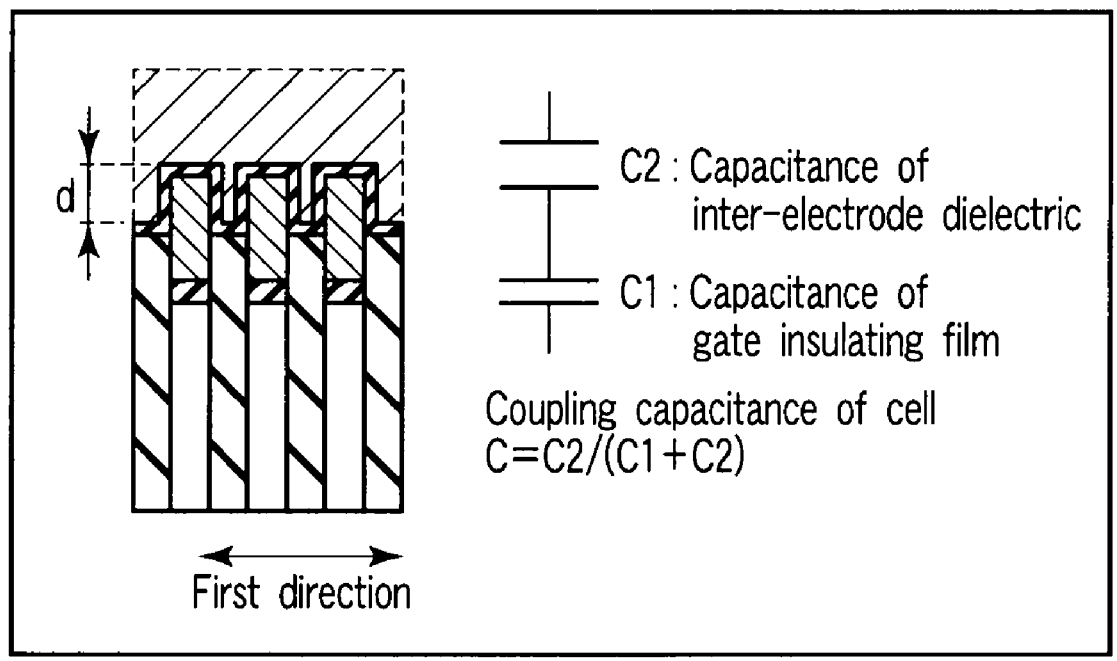
FIG. 21 is a diagram showing a coupling capacitance of a cell.

As a result, when the first active area AA from the endmost portion of the memory cell array area 1 in the first direction is set as the dummy area, the structure of the dummy cell is exactly the same as that of the memory cell (the size is also the same) as shown in FIG. 21. For this reason, the coupling ratio of the dummy cell and that of the memory cell are equal to each other.

The breakage of the dummy cell is, therefore, prevented.

In this case, the step S is formed on the element isolation insulating film 12 outside the periodical structure in the memory cell array area 1, for example, between the memory cell array area 1 and the peripheral circuit area. The position of the step S can be anywhere as long as it is outside the periodical structure.

Figure 22:
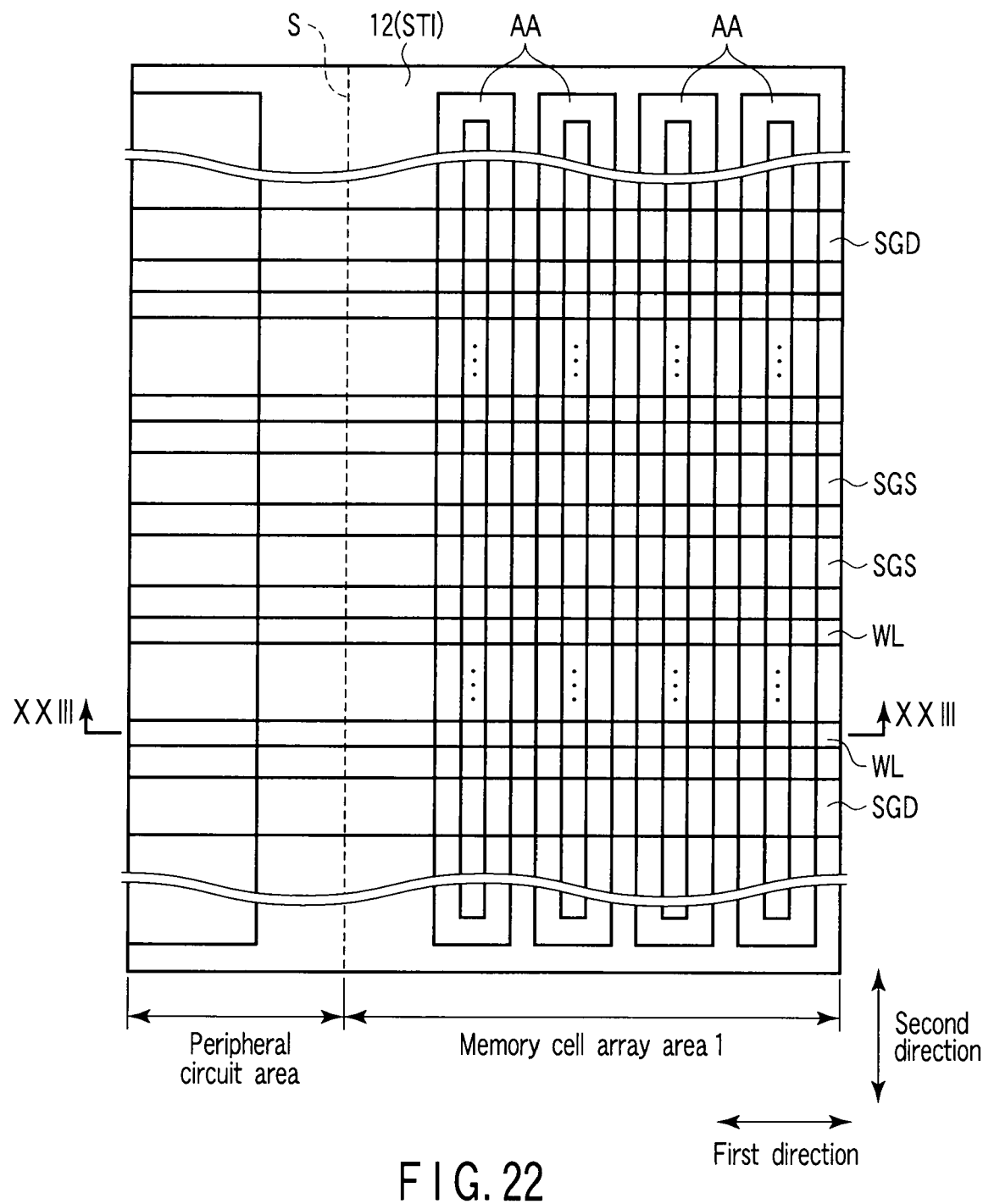
FIG. 22 is a plan view showing one step of the manufacturing method.
Figure 23:
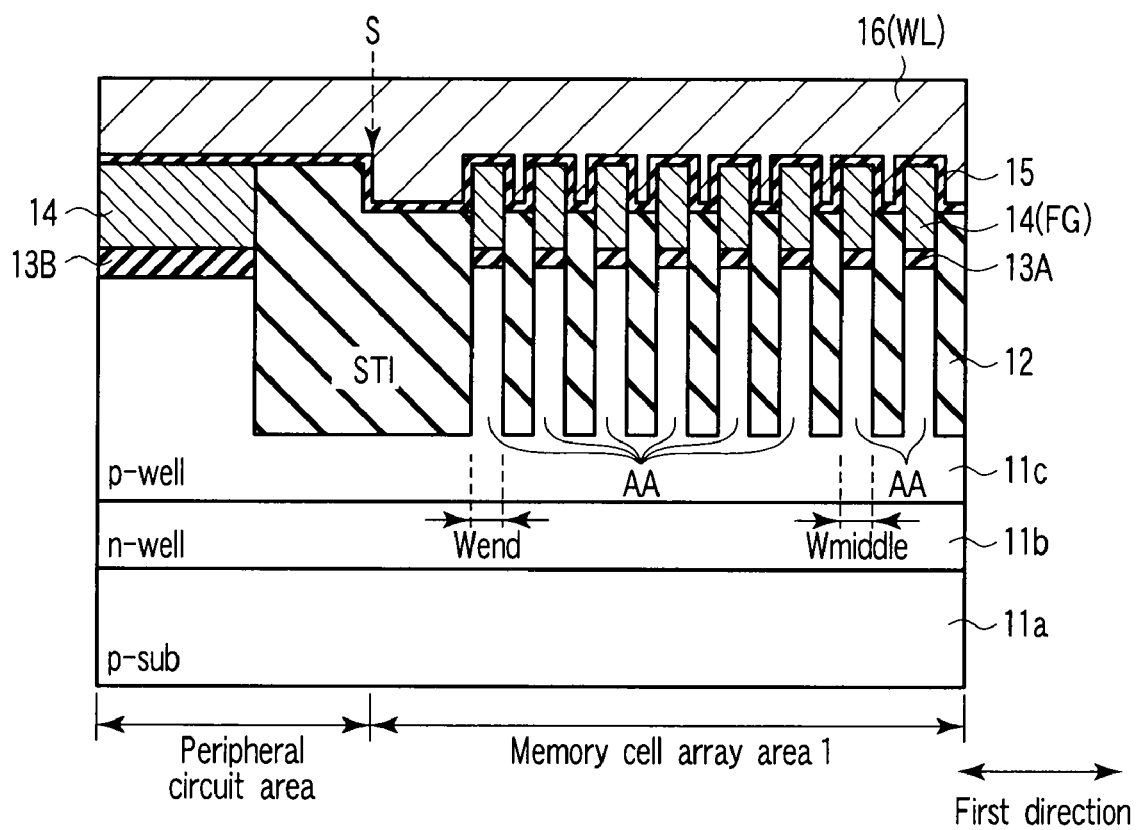
FIG. 23 is a cross-sectional view taken along line XXIII-XXIII of FIG. 22.

Finally, as shown in FIGS. 22 and 23, the inter-electrode insulating film (for example, the ONO film, the high-dielectric-constant material or the like) 15 and the conductive layer 16 are formed.

When the conductive layers 14 and 16, and the inter-electrode insulating film 15 are patterned, the floating gate electrode 14 (FG) and the control gate electrode (word line) 16 (CG) of the memory cells (including the dummy cell) are formed. Further, the select gate lines 16 (SGS) and 16 (SGD) of the select gate transistor are formed.

As a result, the NAND type flash memory shown in FIGS. 4 and 6 is completed.

The above manufacturing method adopts the solidifying process for the second mask layer 18, but even if the solidified process is not used, one-time PEP (photo engraving process) is performed so that the second mask layer 18 remains in the peripheral circuit area.

C. Conclusion

According to the first example, the side wall patterning technique is adopted so that the closed-loop structured active area having uniform width can be formed. As a result, the miniaturization and the improvement in reliability of the memory cell can be simultaneously realized.

(2) Second Example

In contrast to the first example, a second example relates to the closed-loop structured active area where at least the first active area from the endmost portion in the first direction is arranged in the peripheral circuit area.

A. Structure

Figure 24:
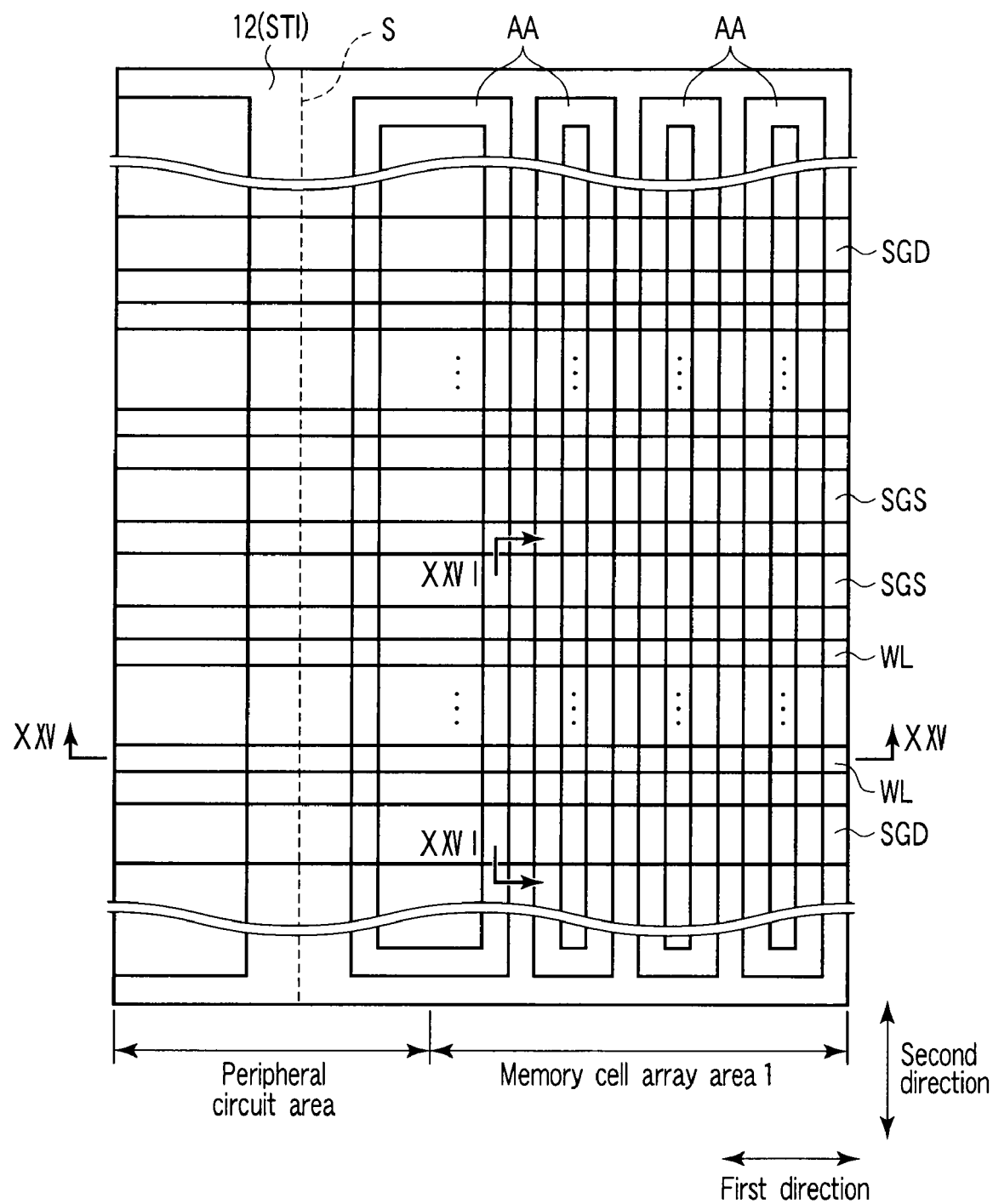
FIG. 24 is a plan view showing a layout of a closed-loop structured active area.
Figure 25:
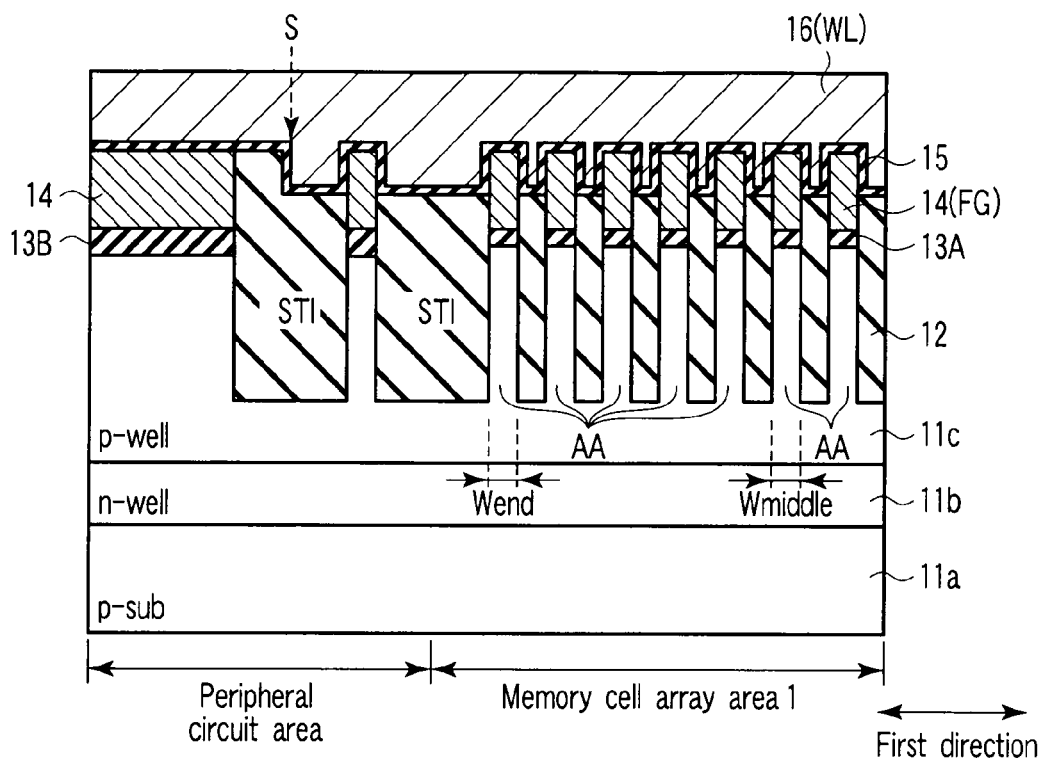
FIG. 25 is a cross-sectional view taken along line XXV-XXV of FIG. 24.
Figure 26:
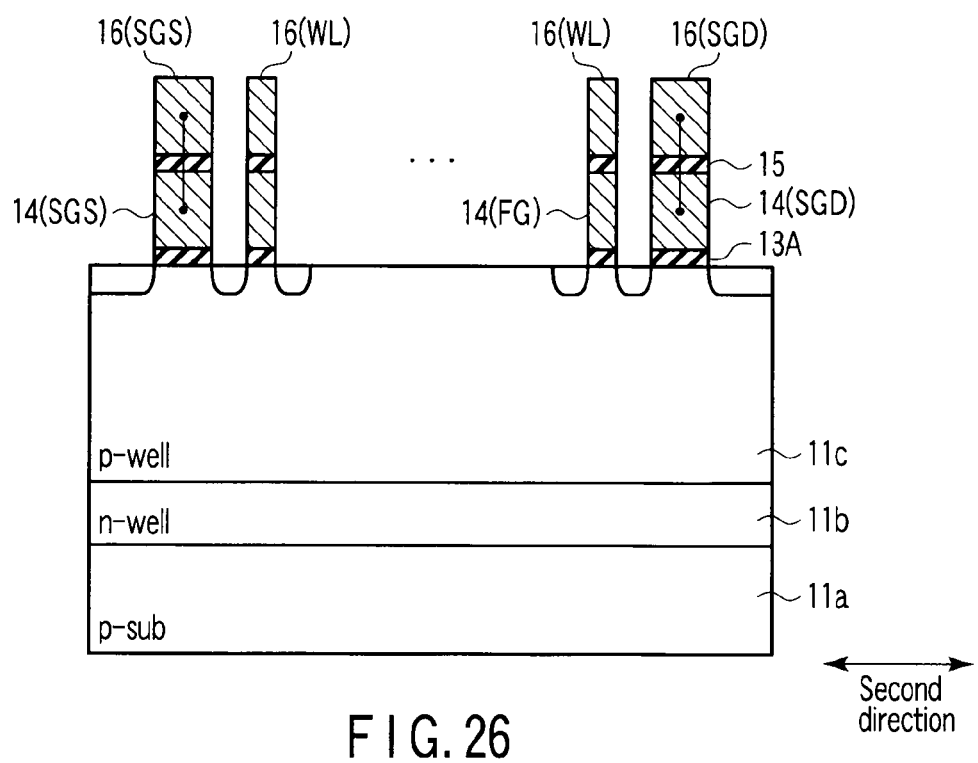
FIG. 26 is a cross-sectional view taken along line XXVI-XXVI of FIG. 24.

FIG. 24 is a plan view showing the memory cell array area. FIG. 25 is a cross-sectional view taken along line XXV-XXV of FIG. 24, and FIG. 26 is a cross-sectional view taken along line XXVI-XXVI of FIG. 24.

The double well region, which includes the n-type well region (n-well) 11b and the p-type well region (p-well) 11c, is formed in the p-type semiconductor substrate (p-sub) 11a.

In the memory cell array area 1, the active areas AA and the element isolation areas (areas other than the active areas AA) are arranged alternately in the first direction so as to form the periodical structure. The n-th (n is odd number) active area AA from the endmost portion in the first direction and the (n+1)-th active area AA are coupled to each other at the endmost portion in the second direction so as to form the closed-loop structure.

The floating gate electrode 14 (FG) and the lower gate electrodes 14 (SGS) and 14 (SGD) are formed on the active areas AA via the gate insulating film (tunnel insulating film) 13A. The floating gate electrode 14 (FG) and the lower gate electrodes 14 (SGS) and 14 (SGD) are made of, for example, a conductive polysilicon layer.

The conductive layer 14 which is made of the same material as that of the floating gate electrode 14 (FG) is formed on the active area AA in the peripheral circuit area via the gate insulating film 13B thicker than the gate insulating film 13A.

The element isolation insulating film 12 having the STI structure is formed in the element isolation area. The upper surface of the element isolation insulating film 12 is flat, and has the step S on the outside of the periodical structure between the active area AA and the element isolation area, for example, between the l-th active area AA in the memory cell array area 1 and the active area AA in the peripheral area.

As to the step S, the upper surface of the element isolation insulating film 12 in the portion of the periodical structure is low.

As a result, a part of the side surface of the floating gate 14 (FG) on the active areas AA in the memory cell array area 1 is exposed from the element isolation insulating film 12.

The control gate electrode (word line) 16 (WL) is formed on the element isolation insulating film 12, the floating gate electrode 14 (FG) and the conductive layer 14 via the inter-electrode insulating film (for example, ONO film, high-di-electric-constant material or the like) 15.

The control gate electrode 16 (WL) extends in the first direction across the memory cell array area 1 and the peripheral circuit area. The control gate electrode 16 (WL) can have a multi-layered structure, for example, a laminated structure composed of a conductive polysilicon layer and a silicide layer.

The upper gate electrodes (select gate lines) 16 (SGS) and 16 (SGD) are formed on the lower gate electrodes 14 (SGS) and 14 (SGD) via the inter-electrode insulating film 15. The lower gate electrodes 14 (SGS) and 14 (SGD), and the upper gate electrodes 16 (SGS) and 16 (SGD) are electrically connected.

The closed-loop structured active areas AA are formed by the side wall patterning technique as described later. According to the side wall patterning technique, the widths of all the active areas AA in the memory cell array area 1 in the first direction can be made uniform and narrower than the limit of resolution of photolithography.

m-th (m=2) and subsequent active areas AA from the endmost portion of the closed-loop structured active areas AA in the first direction are formed in the memory cell array area 1. The active areas AA before the m-th one from the endmost portion in the first direction are formed in the peripheral circuit area.

m=2, but m may be any number not less than 2.

In this case, the gate insulating film 13A is formed on the active areas AA in the memory cell array area 1 of the closed-loop structured active areas AA. The gate insulating film 13B thicker than the gate insulating film 13A is formed on the active areas AA in the peripheral circuit area.

That is, since the gate insulating film 13B is formed on the first active area AA from the endmost portion in the first direction, the MOS transistor having the gate insulating film 13B is highly resistant to breakage caused by a writing potential, and thus the reliability is improved.

The second active area AA from the endmost portion in the first direction in the memory cell array area 1 is set as the dummy area where the dummy cell which does not function as the memory cell is formed. In this case, the width (Wend) of the dummy area in the first direction becomes the same as the width (Wmiddle) of the active areas AA in the first direction where the memory cell is formed.

For this reason, the memory cell and the dummy cell have the same structure and the same size. Specifically, the coupling ratio of the memory cell and that of the dummy cell are equal to each other.

Therefore, even if a writing potential is applied to the word line shared by the memory cell and the dummy cell, an electric field to be applied to the inter-electrode insulating film (or block insulating film) of the dummy cell is equal to an electric field to be applied to the inter-electrode insulating film (or block insulating film) of the memory cell. As a result, the dummy cell is highly resistant to breakage, and thus the reliability is improved.

B. Manufacturing Method

The method for manufacturing the NAND type flash memory shown in FIGS. 24 to 26 will be described.

Figure 27:
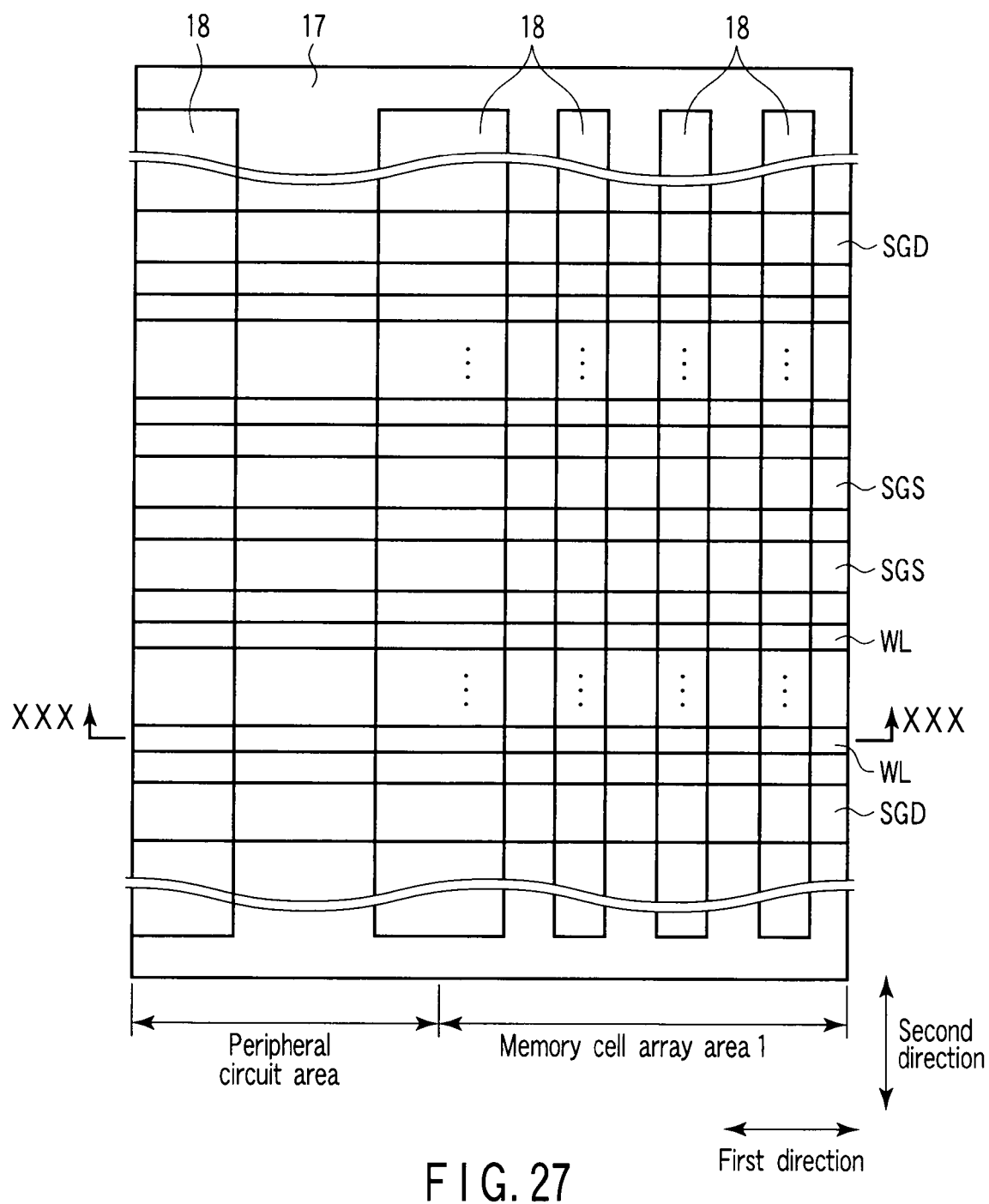
FIG. 27 is a plan view showing one step of the manufacturing method.
Figure 28:
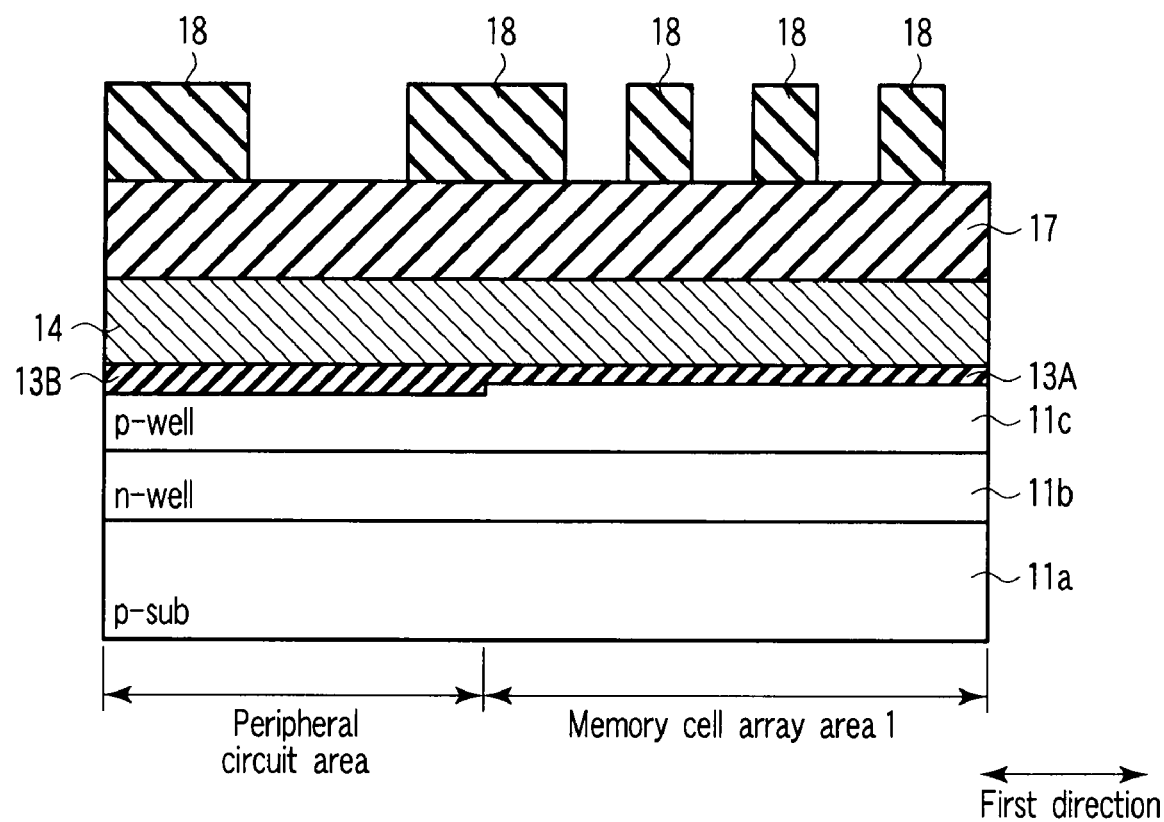
FIG. 28 is a cross-sectional view taken along line XXVIII-XXVIII of FIG. 27.

As shown in FIGS. 27 and 28, the double well region including the n-type well region 11b and the p-type well region 11c is formed in the p-type semiconductor substrate 11a.

The gate insulating film 13A is formed on the p-type well region 11c in the memory cell array area 1, and the gate insulating film 13B thicker than the gate insulating film 13A is formed on the p-type well region 11c in the peripheral circuit area according to the thermal oxidation method.

Thereafter, the conductive layer 14, the first mask layer 17 and the second mask layer 18 are sequentially formed on the gate insulating films 13A and 13B according to the CVD method. The first mask layer 17 and the second mask layer 18 are made of different materials which have different etching selectivities.

Thereafter, the photoresist film 19 is formed on the second mask layer 18.

The photoresist film 19 is processed into a predetermined pattern by the photolithography process. For example, the photoresist film 19 is formed by the line and space pattern in the memory cell array area 1.

The pitches of the lines and spaces of the photoresist film 19 are set to the limit of resolution of photolithography (feature size), for example, 120 nm (line width x=60 nm, space width x=60 nm).

The line width of the photoresist film 19 is set to, for example, 120 nm on a boundary portion between the memory cell array area 1 and the peripheral circuit area.

After the second mask layer 18 is etched by using the photoresist film 19 as a mask according to RIE, the photoresist film 19 is removed.

Figure 29:
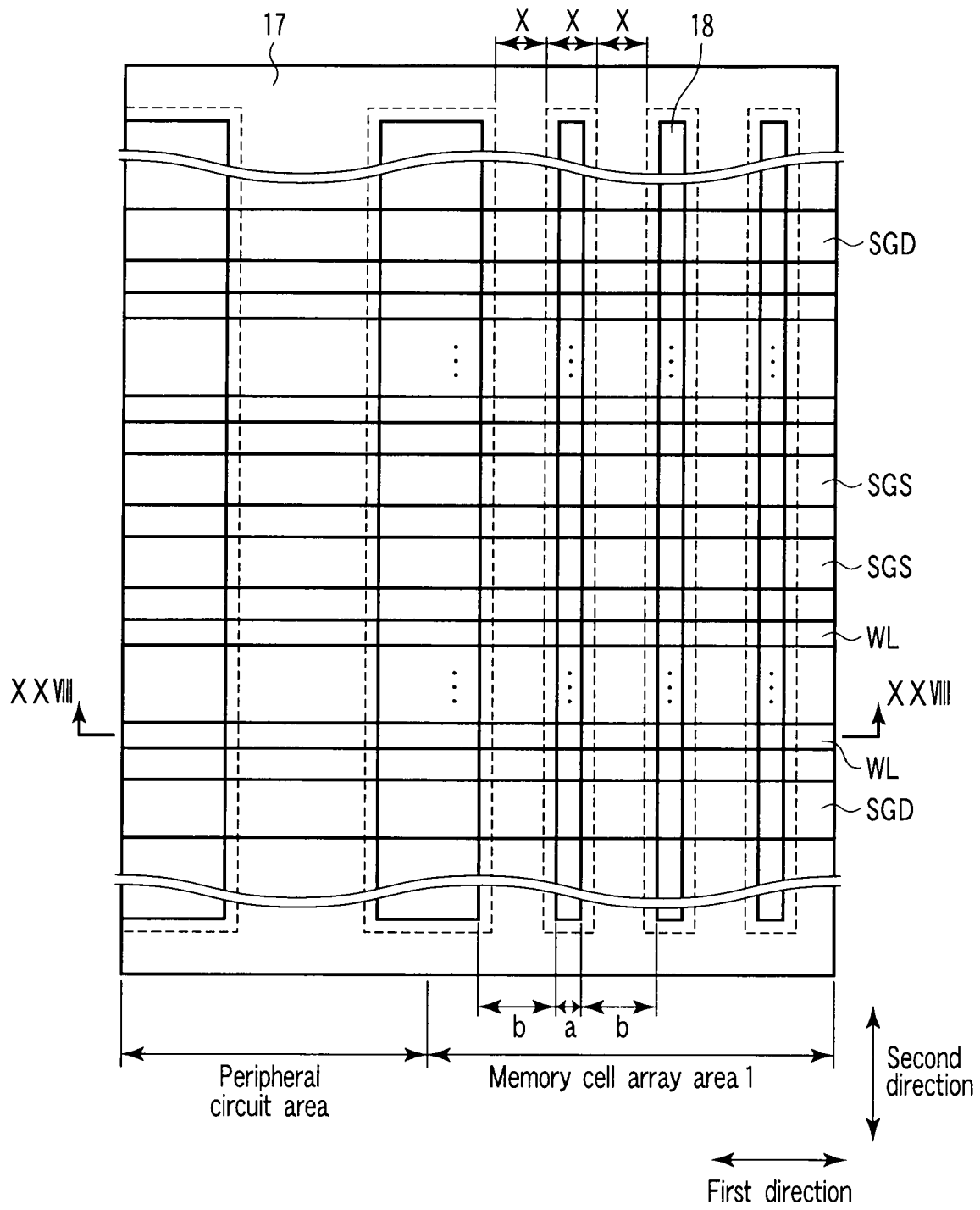
FIG. 29 is a plan view showing one step of the manufacturing method.
Figure 30:
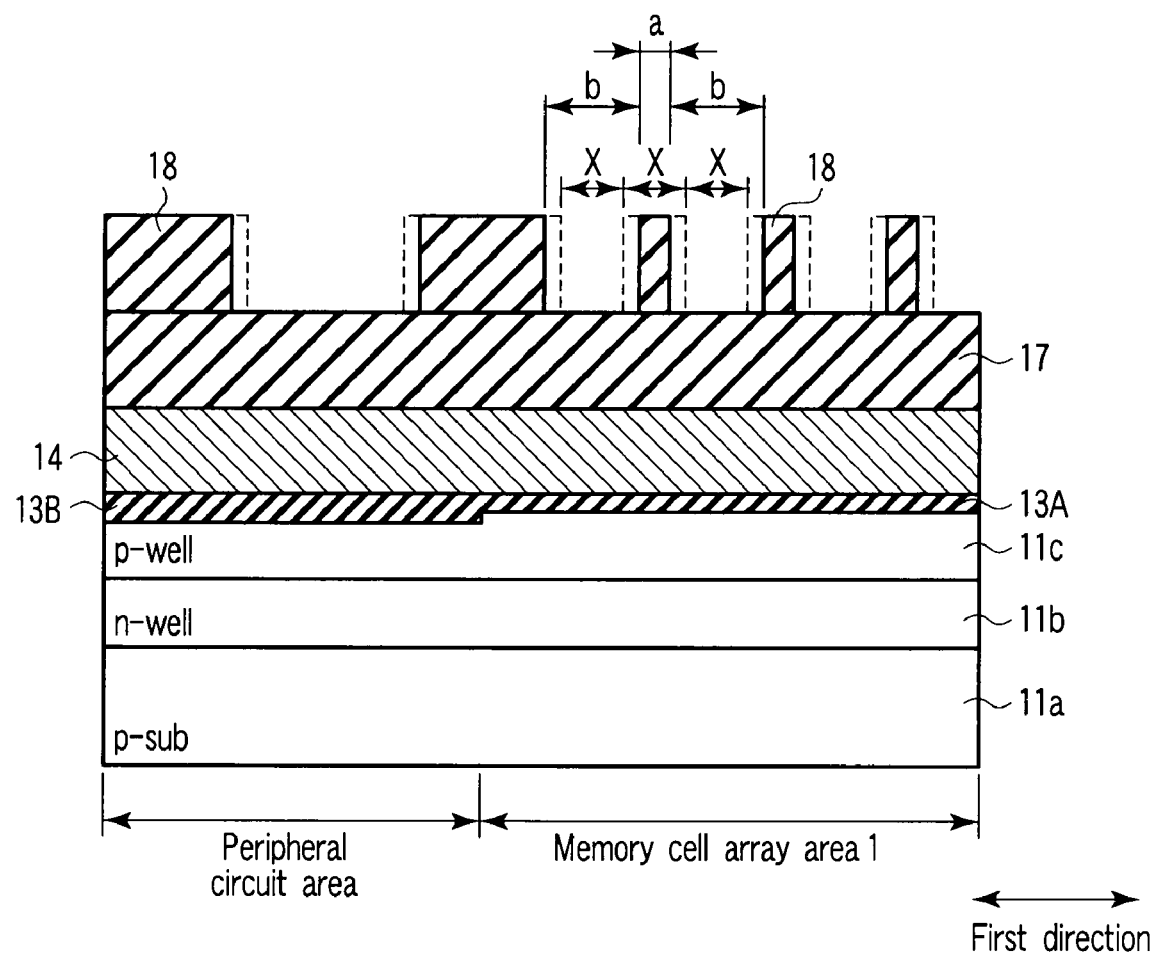
FIG. 30 is a cross-sectional view taken along line XXX-XXX of FIG. 29.

As a result, as shown in FIGS. 29 and 30, the pattern of the photoresist film 19 shown in FIGS. 27 and 28 is transferred onto the second mask layer 18.

Thereafter, the width of the second mask layer 18 is made to be smaller by a slimming technique. The width of the second mask layer 18 becomes smaller than the limit of resolution of photolithography in the memory cell array area 1.

In the cross-sectional view of FIG. 30, a dotted line shows the pattern of the second mask layer 18 before slimming, and a solid line shows the pattern of the second mask layer 18 after slimming.

In the memory cell array area 1, the line width (a) of the second mask layer 18 is set to 30 nm, and the space width (b) thereof is set to 90 nm by the slimming technique.

Figure 31:
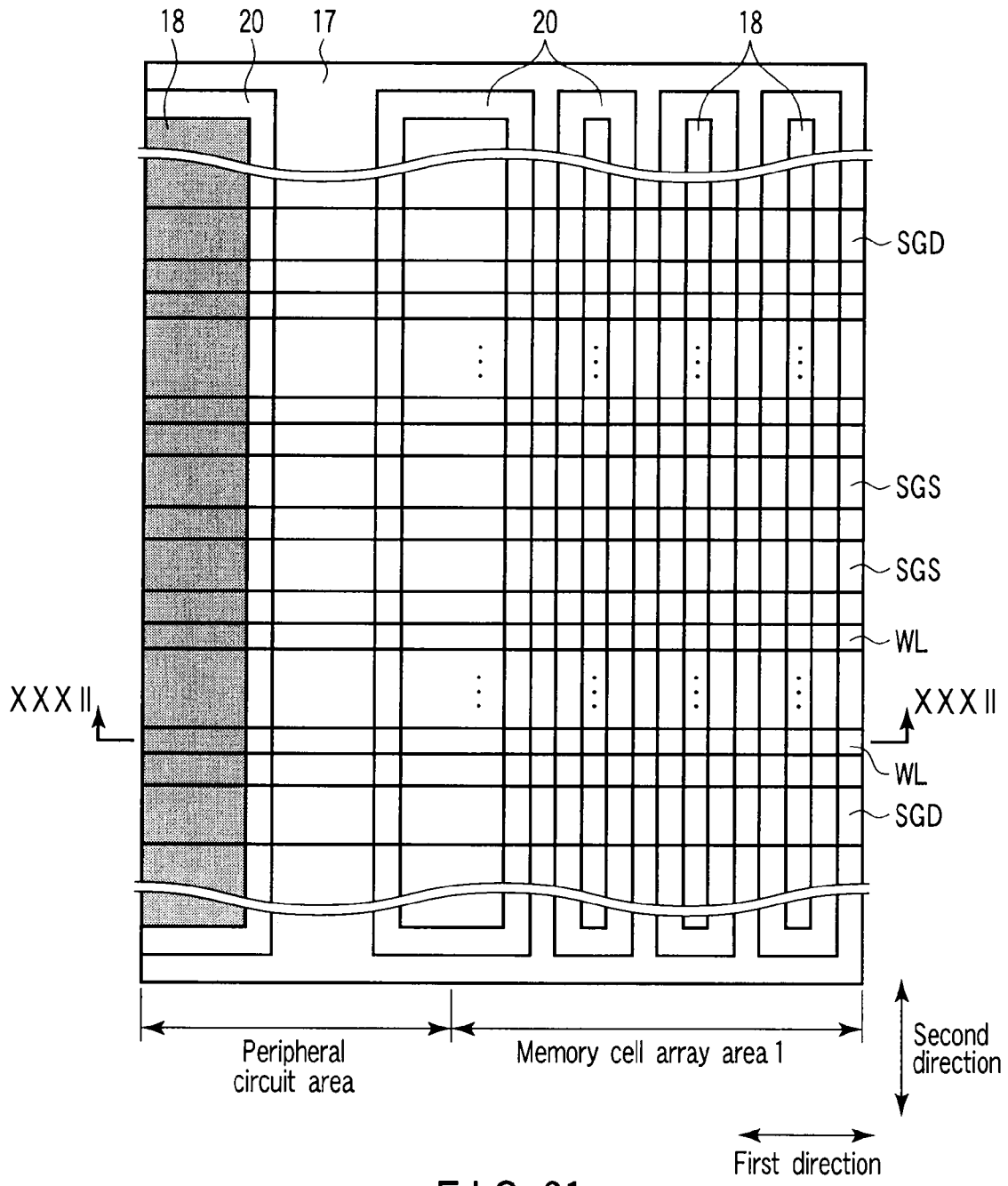
FIG. 31 is a plan view showing one step of the manufacturing method.
Figure 32:
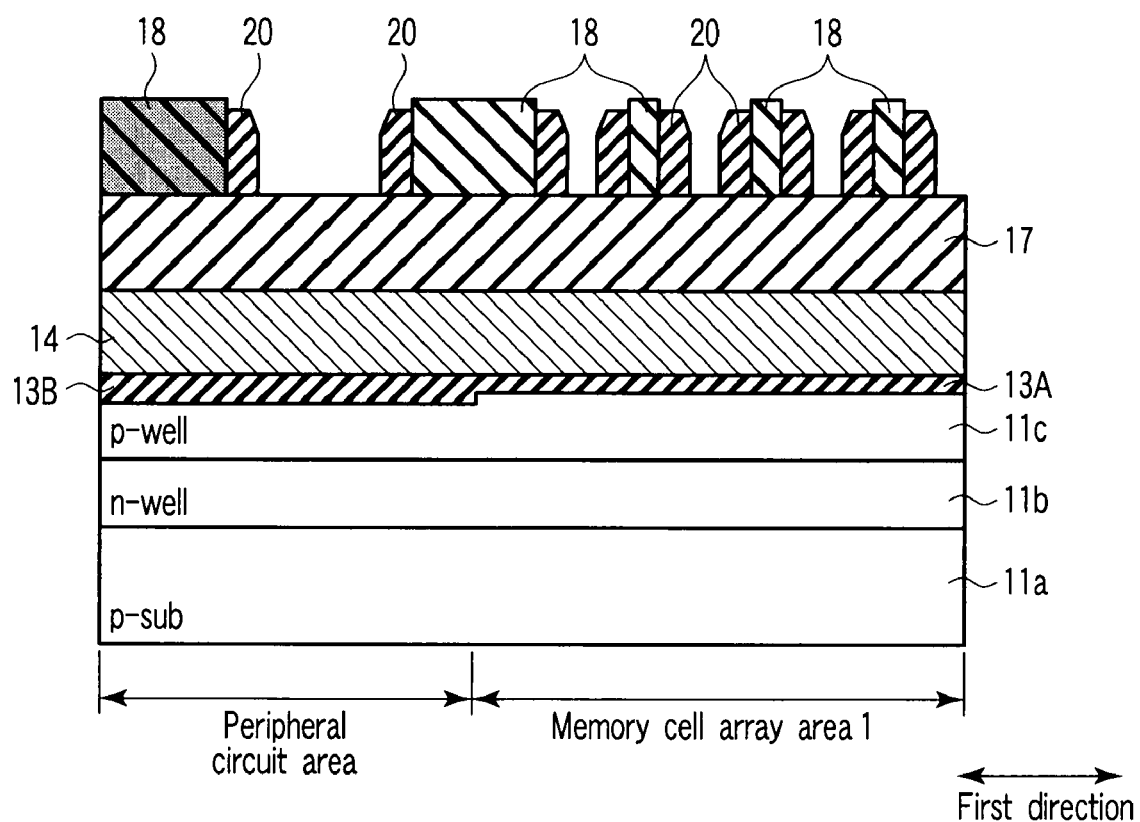
FIG. 32 is a cross-sectional view taken along line XXXII-XXXII of FIG. 31.

As shown in FIGS. 31 and 32, the second mask layer 18 in the peripheral circuit area is solidified. The etching selectivity of the solidified second mask layer 18 becomes sufficiently smaller than that of the unsolidified second mask layer 18 under the same etching condition. The solidified portion is shown in gray.

The third mask layer 20 is formed on the first mask layer 17 and the second mask layer 18 by the CVD method, and is left only on the side wall portion of the second mask layer 18 by RIE.

The third mask layer 20 has the closed-loop shape which surrounds the second mask layer 18.

In the memory cell array area 1, both the width of the second mask layer 18 and the width of the third mask layer 20 are, for example, 30 nm. The space width between the second mask layer 18 and the third mask layer 20 is also 30 nm, for example.

Figure 34:
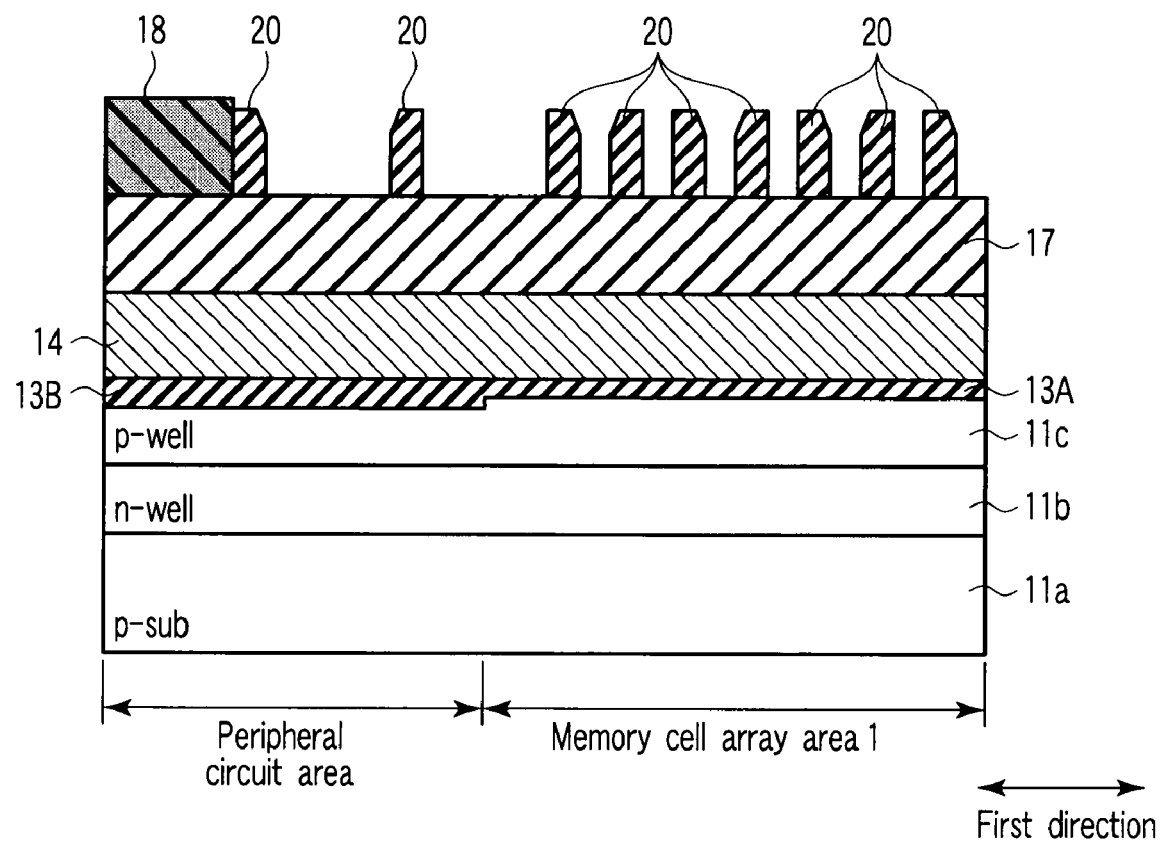
FIG. 34 is a cross-sectional view taken along line XXXIV-XXXIV of FIG. 33.

Thereafter, when only the unsolidified second mask layer 18 is removed, as shown in FIGS. 33 and 34, the line and space structure which is composed of the third mask layer (line width=30 nm) 20 and the space (space width=30 nm) is formed in the memory cell array area 1.

When the first mask layer 17 is etched by using the solidified second mask layer 18 and the third mask layer 20 as the mask according to RIE, the patterns of the solidified second mask layer 18 and the third mask layer 20 are transferred onto the first mask layer 17.

As a result, the fine pattern of the first mask layer 17 is formed by the side wall patterning technique.

This pattern (line=30 nm, space=30 nm) is finer than the limit (feature size) of resolution of photolithography.

Thereafter, the solidified second mask layer 18 and the third mask layer 20 are removed.

Figure 35:
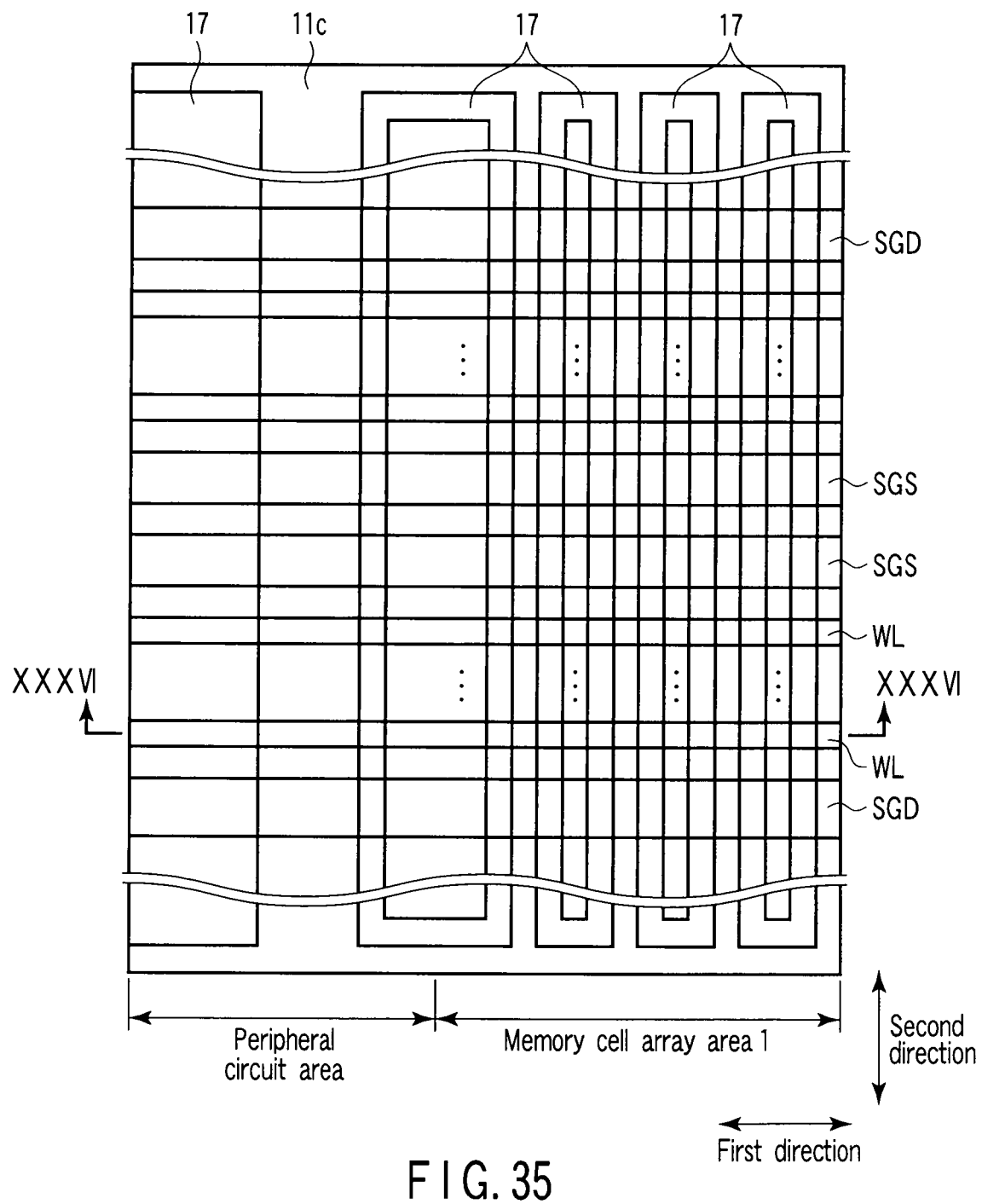
FIG. 35 is a plan view showing one step of the manufacturing method.
Figure 36:
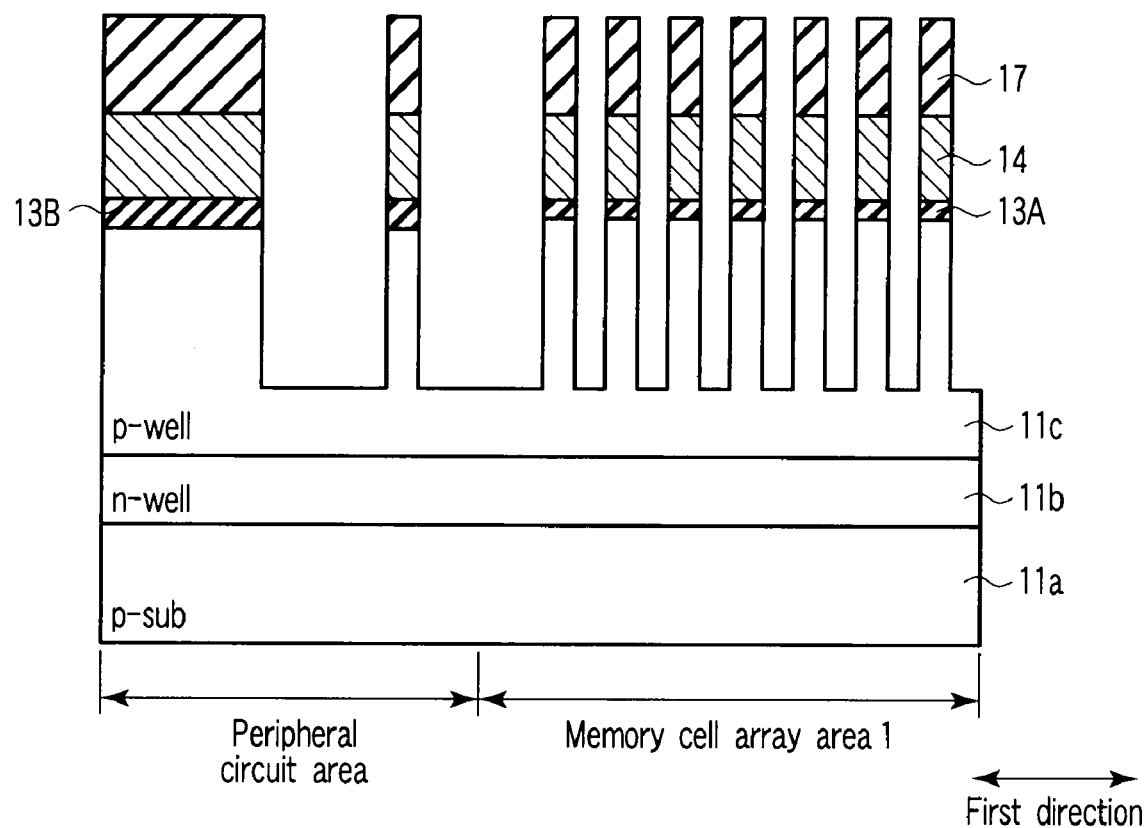
FIG. 36 is a cross-sectional view taken along line XXXVI-XXXVI of FIG. 35.

As shown in FIGS. 35 and 36, the conductive layer 14, the gate insulating films 13A and 13B and the semiconductor substrate (including the n-type well region and the p-type well region) 11a are etched by using the first mask layer 17 as the mask according to RIE, so that the trench is formed.

Figure 37:
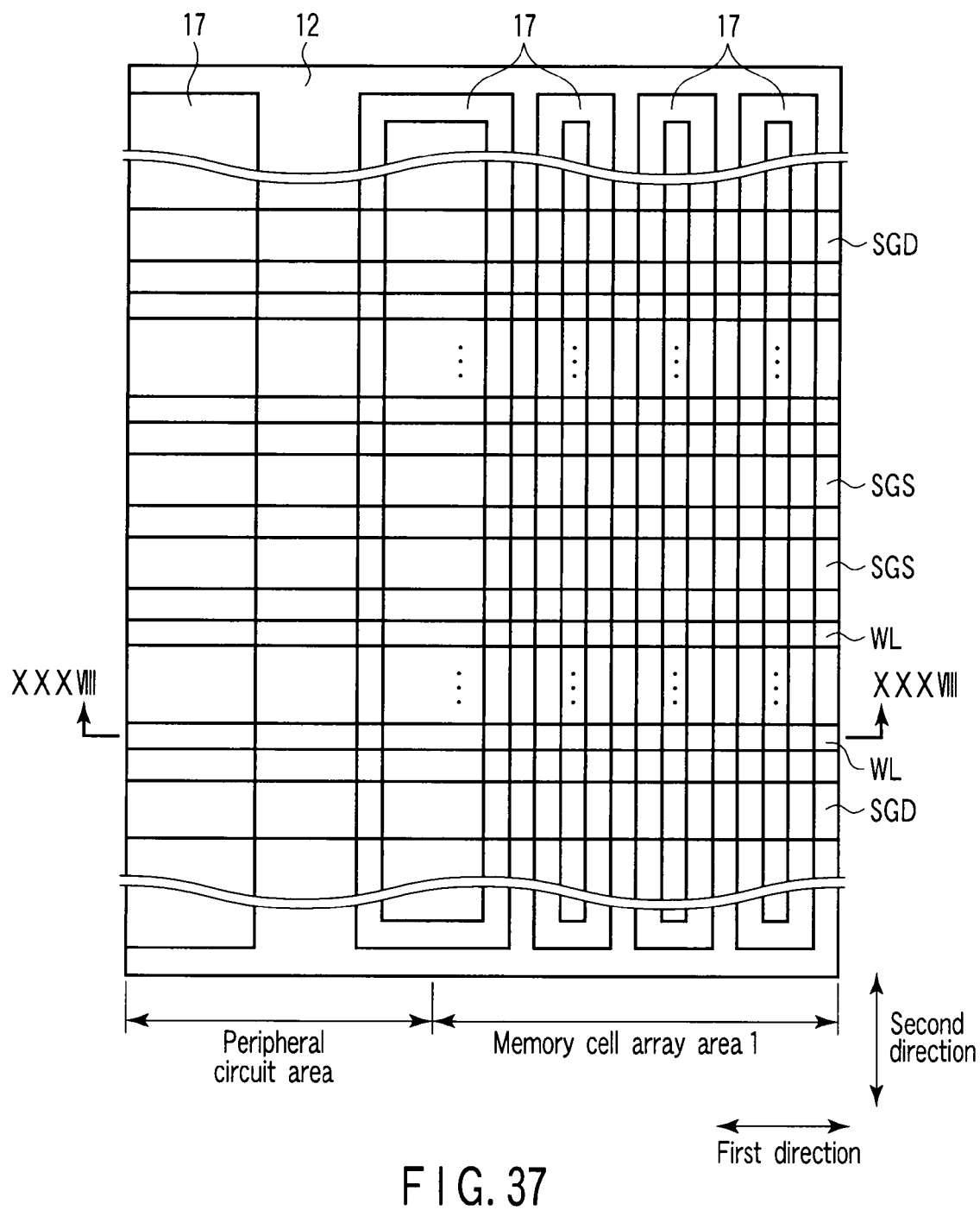
FIG. 37 is a plan view showing one step of the manufacturing method.
Figure 38:
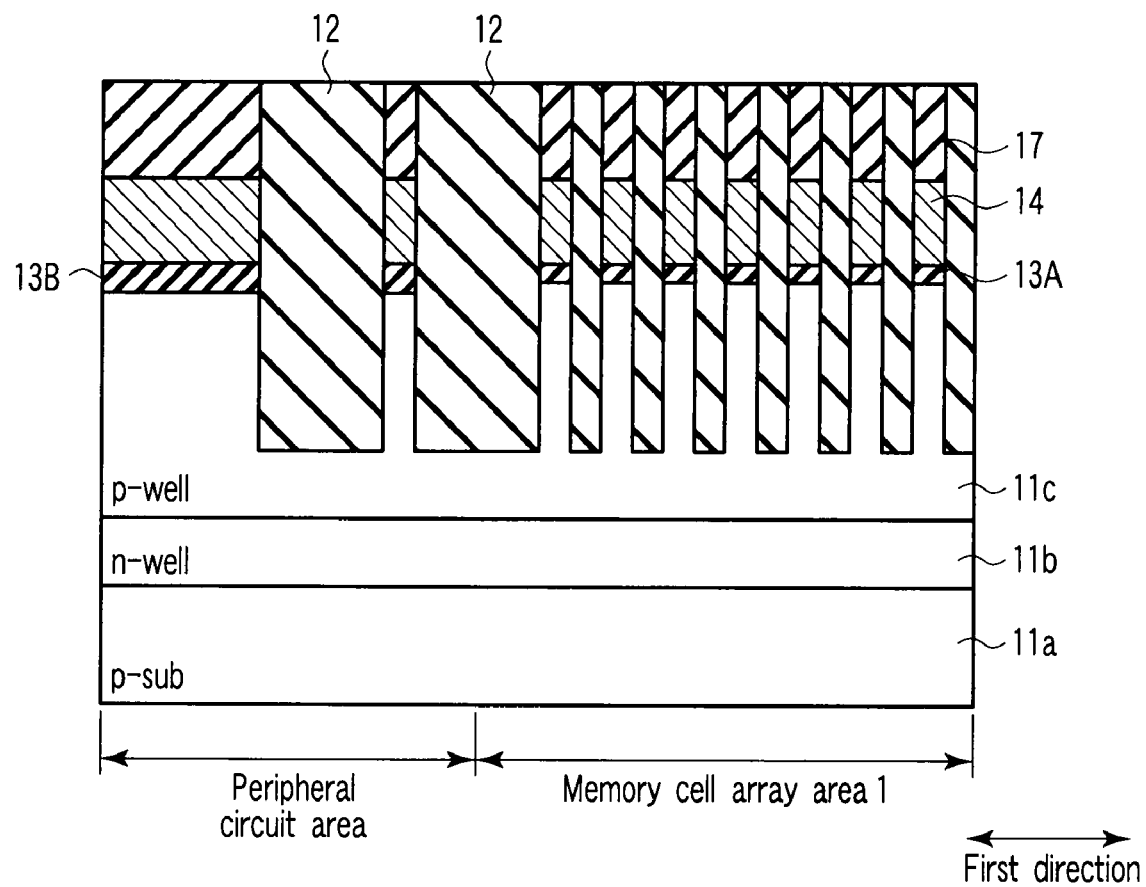
FIG. 38 is a cross-sectional view taken along line XXXVIII-XXXVIII of FIG. 37.

As shown in FIGS. 37 and 38, the trench is filled with the element isolation insulating film 12 according to the CVD method. The upper surface of the element isolation insulating film 12 is flattened by CMP, for example.

The upper surface of the element isolation insulating film 12 approximately matches the upper surface of the first mask layer 17.

Figure 39:
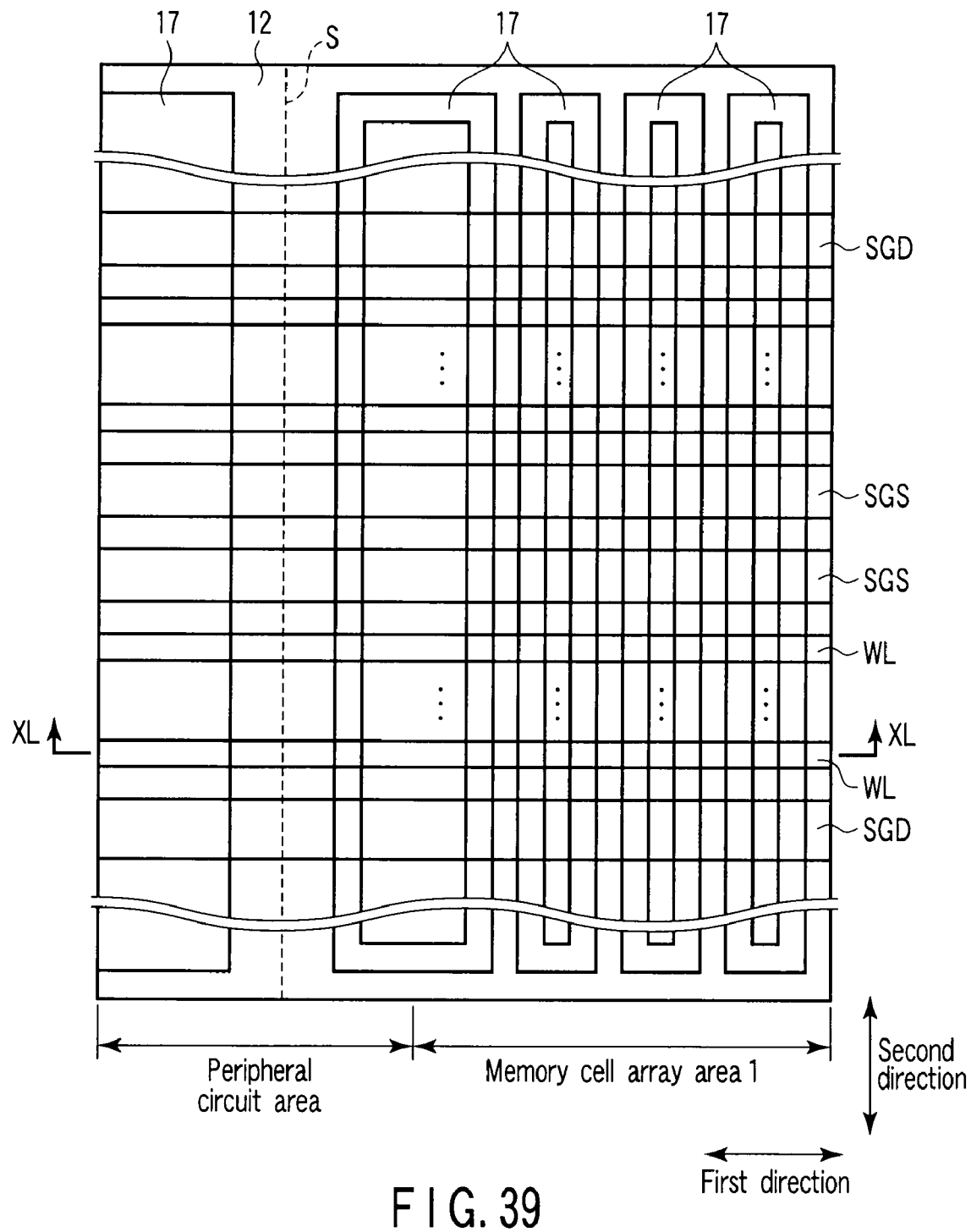
FIG. 39 is a plan view showing one step of the manufacturing method.
Figure 40:
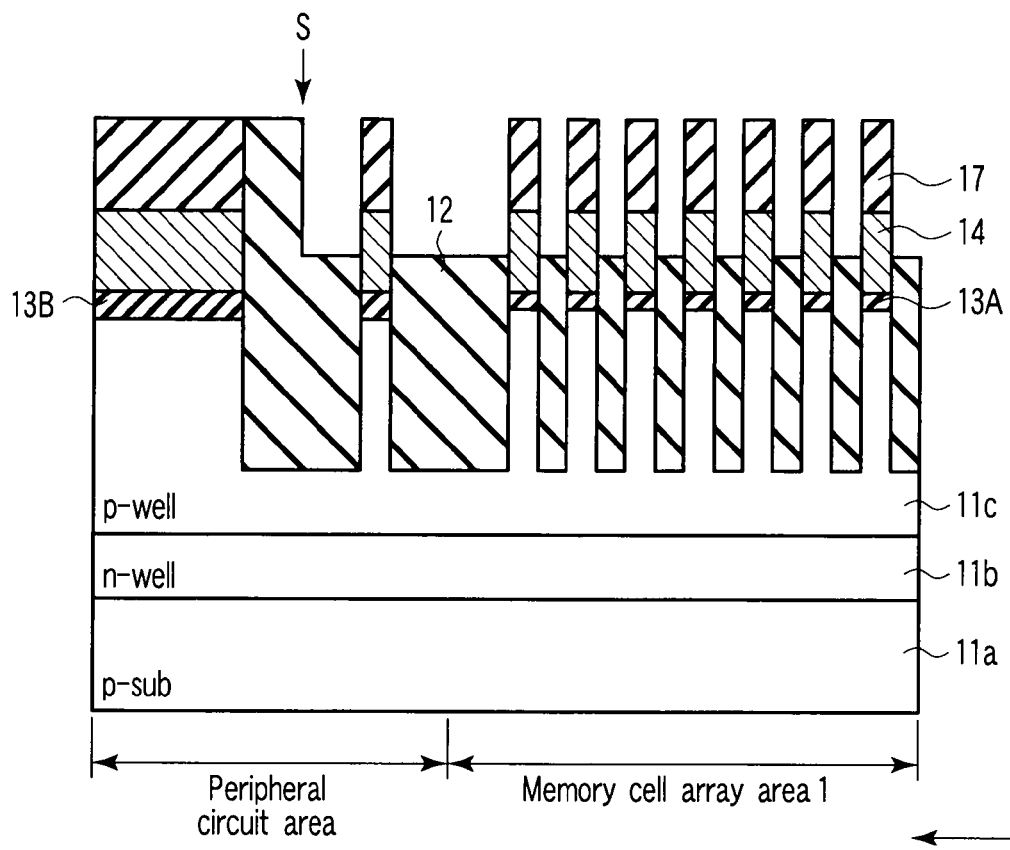
FIG. 40 is a cross-sectional view taken along line XL-XL of FIG. 39.

As shown in FIGS. 39 and 40, the element isolation insulating film 12 in the memory cell array area 1 is selectively etched. The position of the upper surface thereof is lowered, so that the side surface of the conductive layer 14 is partially exposed.

The side surface of the conductive layer 14 on all the active areas (including the dummy area) AA constituting the periodical structure in the memory cell array area 1 and the peripheral circuit area is exposed.

Figure 41:
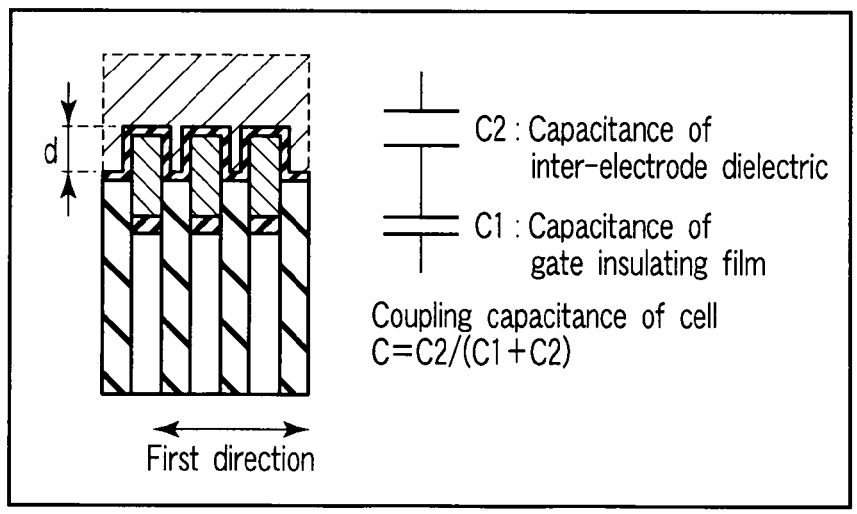
FIG. 41 is a diagram showing a coupling capacitance of the cell.

As a result, when the second active area AA from the endmost portion in the first direction in the memory cell array area 1 is set as the dummy area, the structure of the dummy cell is exactly the same as the memory cell (the size is also the same) as shown in FIG. 41. For this reason, the coupling ratio of the dummy cell and that of the memory are equal to each other.

The breakage of the dummy cell is, therefore, prevented.

In this case, the step S is formed on the element isolation insulating film 12 on the outside of the periodical structure in the memory cell array area 1 and the peripheral circuit area. The position of the step S can be anywhere as long as it is on the outside of the periodical structure.

Figure 42:
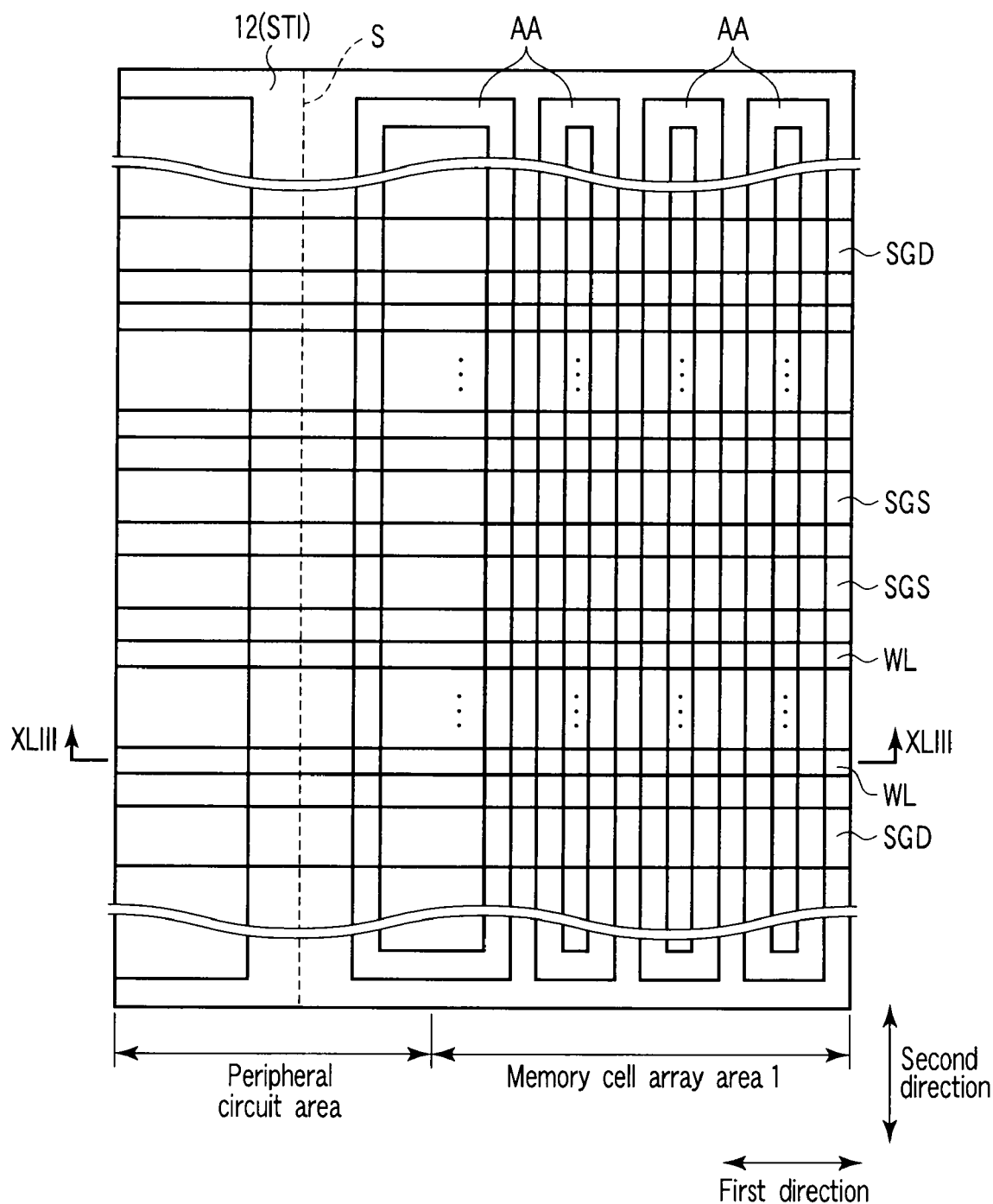
FIG. 42 is a plan view showing one step of the manufacturing method.
Figure 43:
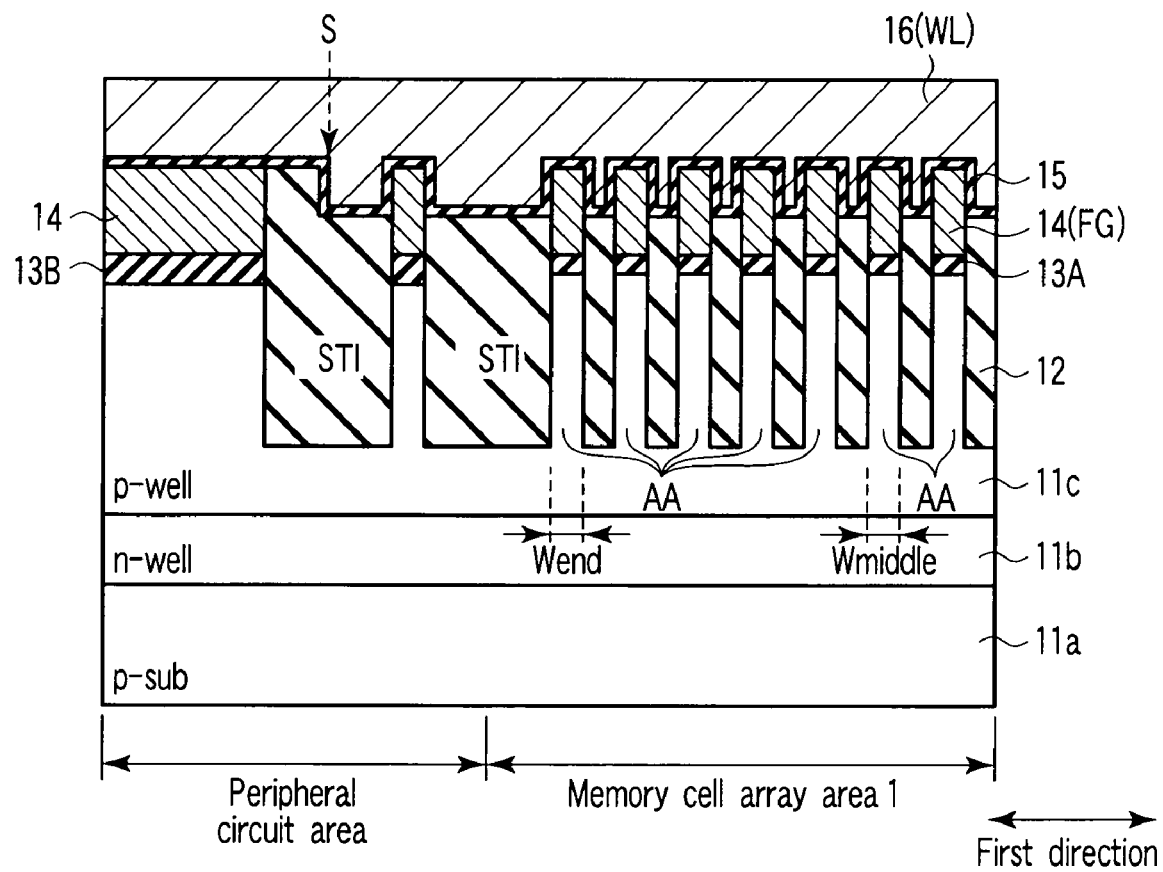
FIG. 43 is a cross-sectional view taken along line XLIII-XLIII of FIG. 42.

Finally as shown in FIGS. 42 and 43, the inter-electrode insulating film (for example, ONO film, high-dielectric-constant material or the like) 15 and the conductive layer 16 are formed.

When the conductive layers 14 and 16 and the inter-electrode insulating film 15 are patterned, the floating gate electrode 14 (FG) and the control gate electrode (word line) 16 (CG) of the memory cell (including the dummy cell) are formed. At the same time, the select gate lines 16 (SGS) and 16 (SGD) of the select gate transistor are formed.

The NAND type flash memory shown in FIGS. 24 to 26 is thus completed.

The above manufacturing method adopts the solidifying process for the second mask layer 18, but similarly to the first example, even if the solidifying process is not used, one-time PEP is performed so that the second mask layer 18 is left in the peripheral circuit area.

C. Conclusion

According to the second example, employing the side wall patterning technique enables the closed-loop structured active areas having a uniform width to be formed. As a result, the miniaturization and the improvement in reliability of the memory cell can be simultaneously realized.

The first active area AA from the endmost portion in the first direction may be arranged in the peripheral circuit area. Then, the gate insulating film 13B on the active areas AA is thicker than that of the memory cell. As a result, the improvement in reliability of the memory cell can be simultaneously realized effectually.

4. MODIFICATION EXAMPLE

Some modification examples of the present invention will be described.

The position of the step of the element isolation insulating film can be set between the (m−1)-th active area from the endmost portion in the first direction and the m-th active area in the second example. However, m is any number not less than 2.

Figure 44:
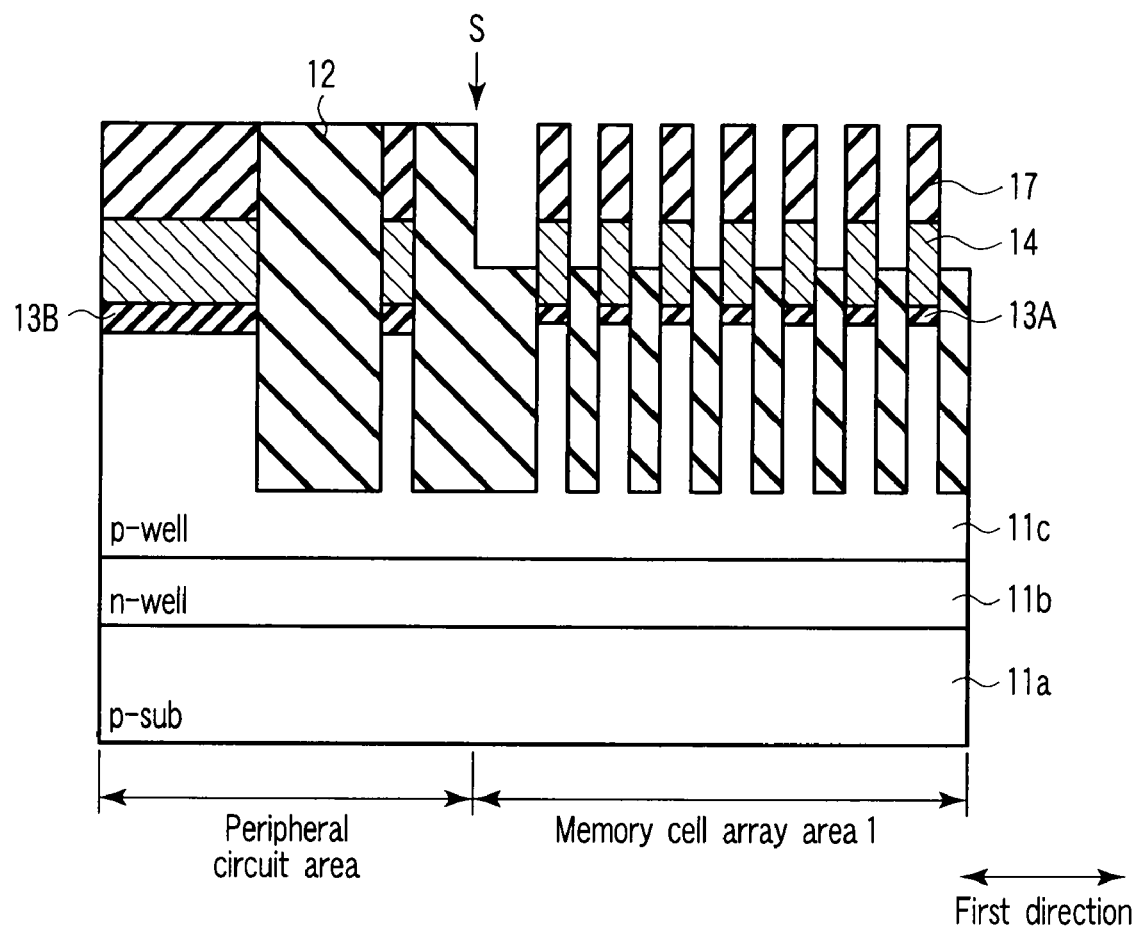
FIG. 44 is a cross-sectional view showing a modification example of a step position.
Figure 45:
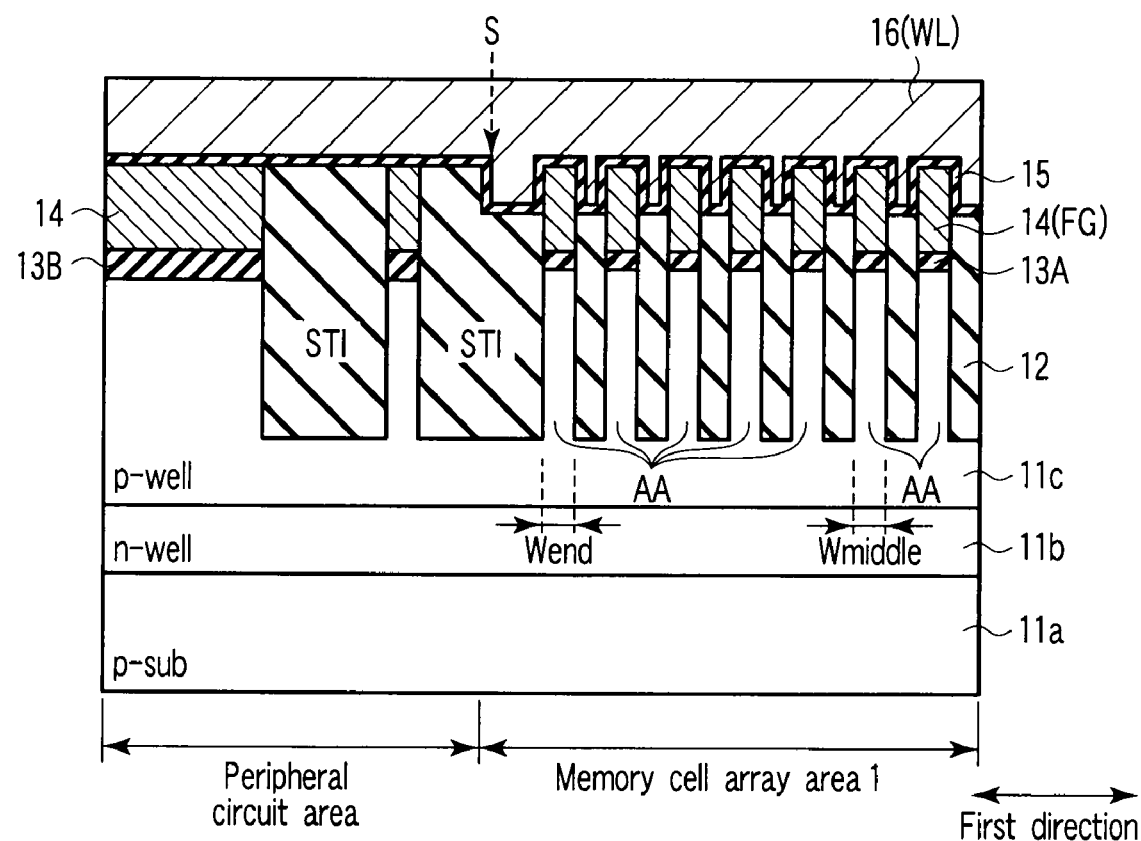
FIG. 45 is a cross-sectional view showing a modification example of the step position.

For example as shown in FIGS. 44 and 45, the step may be set between the first active area AA from the endmost portion in the first direction and the second active area AA in the closed-loop structured active areas AA constituting the periodical structure.

FIGS. 44 and 45 correspond to FIGS. 40 and 43 in the above manufacturing method.

In this case, as is clear from FIG. 45, an opposed area between the conductive layer 14 and the control gate electrode 16 (WL) is small on the first active area AA from the endmost portion in the first direction. As a result, the capacitance of the capacitor (corresponding to C2 in FIG. 41) to be formed thereon becomes small, and thus the breakage of the inter-electrode insulating film is concerned.

However, since the first active area AA from the endmost portion in the first direction is arranged in the peripheral circuit area, the gate insulating film 13B on the active areas AA is thicker than that of the memory cell. As a result, the capacitance of the capacitor (corresponding to C1 in FIG. 41) to be formed thereon becomes small.

Therefore, in the case of the second example, even when the position of the step of the element isolation insulating film is set inside the periodical structure, the reliability of the semiconductor memory is sufficiently maintained.

As a matter of course, as described in the second example, when the position of the step of the element isolation insulating film is set on the outside of the periodical structure, the reliability can be further improved.

In the first and second examples, the structure of the memory cell is not limited to a stack gate type which has the floating gate electrode and the control gate electrode.

FIG. 46 shows the memory cell structure as a modification example.

This memory cell is of a so-called MONOS type.

The above example refers to the stack gate type memory cell, but the present invention can be a MONOS type memory cell (including a dummy cell).

The MONOS type memory cell is a nonvolatile semiconductor memory cell in which a charge accumulation layer is composed of an insulating film.

A source/drain diffusion layer 22 is arranged in the semiconductor substrate (active area) 21. A gate insulating film (tunnel insulating film) 23, a charge accumulation layer 24, a block insulating film 25 and a control gate electrode (word line) 26 are arranged on a channel area between the source/drain diffusion layers 22.

The block insulating film 25 is composed of, for example, an ONO (oxide/nitride/oxide) film or a high-dielectric-constant (high-k) material.

5. APPLICATION EXAMPLE

An example of a system to which the semiconductor memory of the present invention is applied will be described.

FIG. 47 shows one example of the memory system.

This system is, for example, a memory card or a USB memory.

A circuit substrate 32, and a plurality of semiconductor chips 33, 34 and 35 are arranged in a package 31. The circuit substrate 32 and the semiconductor chips 33, 34 and 35 are electrically connected by a bonding wire 36. One of the semiconductor chips 33, 34 and 35 is the semiconductor memory of the present invention.

Figure 48:
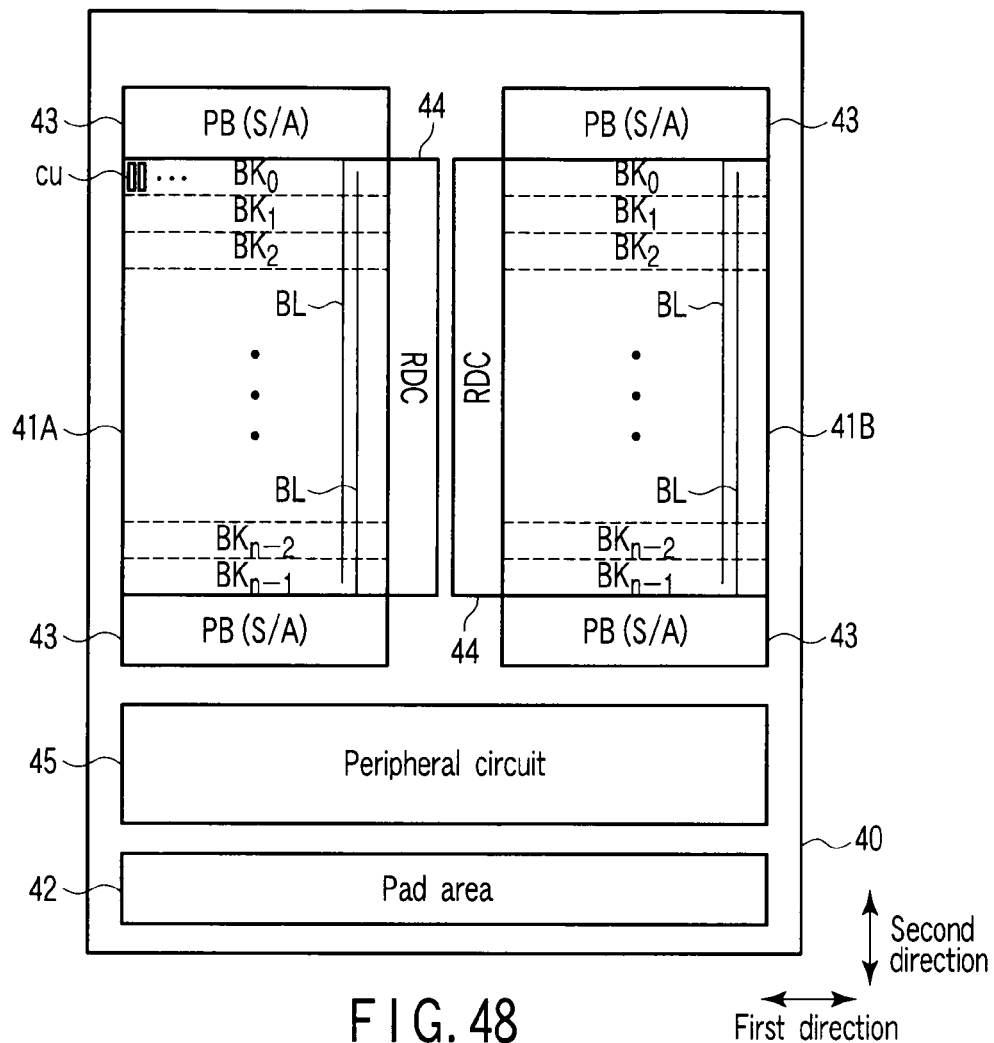
FIG. 48 is a diagram showing a layout of a semiconductor memory as an application example.

FIG. 48 shows a chip layout of the semiconductor memory as the application example.

Memory cell arrays 41A and 41B are arranged on a semiconductor chip 40. The memory cell arrays 41A and 41B each have blocks BK0, BK1, ... BKn−1 which are arranged in the second direction. The blocks BK0, BK1, ... BKn−1 have a plurality of cell units CU which are arranged in the first direction, respectively.

Figure 49:
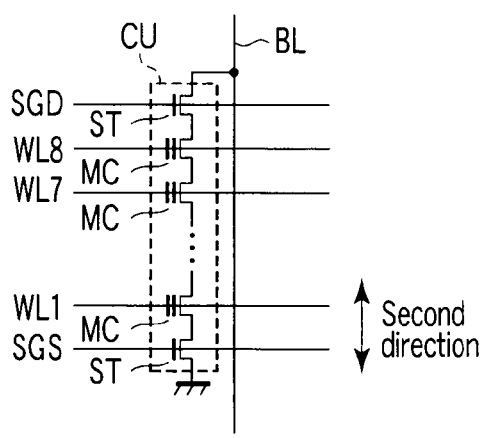
FIG. 49 is a diagram showing a NAND cell unit.

As shown in FIG. 49, the cell unit CU is a NAND string which is composed of a plurality of memory cells MC connected in series in the second direction, and two select gate transistors ST connected to both ends of the memory cell MC.

Bit lines BL which extend in the second direction are arranged on the memory cell arrays 41A and 41B. A page buffer (PB) 43 is arranged on both ends of the memory cell arrays 41A and 41B in the second direction. The page buffer 43 has a function to temporarily store reading data/writing data therein at the time of reading/writing. The page buffer 43 functions as a sense amplifier during reading or verifying of a writing/erasing operation.

A row decoder (RDC) 44 is arranged at one end (the end portion opposite to the end portion on the edge side of the semiconductor chip 40) of the memory cell arrays 41A and 41B in the first direction. A pad area 42 is arranged along the edge of the semiconductor chip 40 on one end of the memory cell arrays 41A and 41B in the second direction. A peripheral circuit 45 is arranged between the page buffer 43 and the pad area 42.

6. CONCLUSION

According to the present invention, the miniaturization of the memory cell is compatible with the improvement in the reliability due to the new active area structure of the memory cell array.

According to the present invention, the widths of the closed-loop structured active areas become uniform, but this uniformity includes a slight difference in the widths due to patterning dispersion.

Additional advantages and modifications will readily occur to those skilled in the art. Therefore, the invention in its broader aspects is not limited to the specific details and representative embodiments shown and described herein. Accordingly, various modifications can be made without departing from the spirit or scope of the general inventive concept as defined by the appended claims and their equivalents.

What is claimed is:

1. A semiconductor memory comprising:

active areas; and element isolation areas which isolate the active areas, wherein the element isolation areas have an element isolation insulating film, the element isolation insulating film has a step between an (m−1)-th (m is integer number not less than 2) active area from an endmost portion in a first direction and the m-th active area, and a width in the first direction between the (m−1)-th active area and the m-th active area is wider than that between the m-th active area and an (m+1)-th active area.

2. The semiconductor memory according to claim 1, wherein m-th or less active areas from the endmost portion in the first direction is a dummy area where a dummy cell which does not function as a memory cell is formed.

3. The semiconductor memory according to claim 2, wherein a structure of the dummy cell is the same as a structure of the memory cell.

4. The semiconductor memory according to claim 1, wherein m−1-th or less active areas from the endmost portion in the first direction is arranged in a peripheral circuit area.

5. The semiconductor memory according to claim 1, wherein a first gate insulating film is formed on the m-th and subsequent active areas from the endmost portion in the first direction, and a second gate insulating film thicker than the first gate insulating film is formed on active areas before the m-th active area from the endmost portion in the first direction.

6. The semiconductor memory according to claim 1, wherein the m is an odd number, and the active areas and the element isolation areas are arranged alternately in the first direction, and the m-th active area from the endmost portion in the first direction and the (m+1)-th active area are coupled to each other at an endmost portion in a second direction perpendicular to the first direction.

7. The semiconductor memory according to claim 1,
wherein the element isolation areas have an element isolation insulating film, and the element isolation insulating film has a step on the outside of a periodical structure of the active areas.

8. The semiconductor memory according to claim 1,
wherein pitches of the active areas change, and are the widest at the endmost portion in the first direction.

9. The semiconductor memory according to claim 1,
the width in the first direction of the m-th active area from the endmost portion in the first direction is equal to that of the (m+1)-th active area.

10. A semiconductor memory comprising:
active areas; and
element isolation areas which isolate the active areas,
wherein the element isolation areas have an element isolation insulating film, the element isolation insulating film has a step between an (m−1)-th (m is integer number not less than 2) active area from an endmost portion in a first direction and the m-th active area, a width in the first direction between the (m−1)-th active area and the m-th active area is wider than that between the m-th active area and an (m+1)-th active area, and the (m−1)-th active area and the m-th active area are coupled to each other at an endmost portion in a second direction perpendicular to the first direction.

11. The semiconductor memory according to claim 10,
wherein m-th or less active areas from the endmost portion in the first direction is a dummy area where a dummy cell which does not function as a memory cell is formed.

12. The semiconductor memory according to claim 10,
wherein a structure of the dummy cell is the same as a structure of the memory cell.

13. The semiconductor memory according to claim 10,
wherein m−1-th or less active areas from the endmost portion in the first direction is arranged in a peripheral circuit area.

14. The semiconductor memory according to claim 10,
wherein a first gate insulating film is formed on the m-th and subsequent active areas from the endmost portion in the first direction, and a second gate insulating film thicker than the first gate insulating film is formed on active areas before the m-th active area from the endmost portion in the first direction.

15. The semiconductor memory according to claim 10,
wherein the (m−1)-th active area from the endmost portion in the first direction and the m-th active area are coupled to each other at two endmost portions in the second direction to form a loop structure.

16. The semiconductor memory according to claim 10,
wherein the element isolation areas have an element isolation insulating film, and the element isolation insulating film has a step on the outside of a periodical structure of the active areas.

17. The semiconductor memory according to claim 10,
wherein pitches of the active areas change, and are the widest at the endmost portion in the first direction.

18. The semiconductor memory according to claim 10,
the width in the first direction of the m-th active area from the endmost portion in the first direction is equal to that of the (m+1)-th active area.

* * * * *